United States Patent
Yamazaki

(10) Patent No.: US 7,910,457 B2
(45) Date of Patent: Mar. 22, 2011

(54) SEMICONDUCTOR SUBSTRATE, SEMICONDUCTOR DEVICE AND MANUFACTURING METHOD THEREOF

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 129 days.

(21) Appl. No.: 12/078,084

(22) Filed: Mar. 27, 2008

(65) Prior Publication Data

US 2008/0283916 A1 Nov. 20, 2008

(30) Foreign Application Priority Data

May 18, 2007 (JP) ................. 2007-133065

(51) Int. Cl.
*H01L 21/30* (2006.01)
(52) U.S. Cl. ............. 438/458; 257/618; 257/E21.122
(58) Field of Classification Search .......... 438/455, 438/480, 487; 257/E21.122
See application file for complete search history.

(56) References Cited

U.S. PATENT DOCUMENTS

| | | | |
|---|---|---|---|
| 5,374,564 A | 12/1994 | Bruel | |
| 6,127,702 A | 10/2000 | Yamazaki et al. | |
| 6,271,101 B1 | 8/2001 | Fukunaga | |
| 6,335,231 B1 | 1/2002 | Yamazaki et al. | |
| 6,372,609 B1 | 4/2002 | Aga et al. | |
| 6,380,046 B1 | 4/2002 | Yamazaki | |
| 6,388,652 B1 | 5/2002 | Yamazaki et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 7,176,525 B2 | 2/2007 | Fukunaga | |
| 7,199,024 B2 | 4/2007 | Yamazaki | |
| 7,256,776 B2 | 8/2007 | Yamazaki et al. | |
| 2004/0104424 A1 | 6/2004 | Yamazaki | |
| 2005/0009252 A1 | 1/2005 | Yamazaki et al. | |
| 2007/0108510 A1 | 5/2007 | Fukunaga | |
| 2007/0173000 A1 | 7/2007 | Yamazaki | |
| 2007/0184632 A1 | 8/2007 | Yamazaki et al. | |
| 2007/0291022 A1 | 12/2007 | Yamazaki et al. | |

FOREIGN PATENT DOCUMENTS

JP 11-284201 10/1999

*Primary Examiner* — Matthew C Landau
*Assistant Examiner* — Sonya D McCall Shepard
(74) *Attorney, Agent, or Firm* — Eric J. Robinson; Robinson Intellectual Property Law Offic, P.C.

(57) ABSTRACT

It is an object to provide a method for manufacturing a semiconductor substrate in which contamination of a semiconductor layer due to an impurity is prevented and the bonding strength between a support substrate and the semiconductor layer can be increased. An oxide film containing first halogen is formed on a surface of a semiconductor substrate, and the semiconductor substrate is irradiated with ions of second halogen, whereby a separation layer is formed and the second halogen is contained in a semiconductor substrate. Then, heat treatment is performed in a state in which the semiconductor substrate and the support substrate are superposed with an insulating surface containing hydrogen interposed therebetween, whereby part of the semiconductor substrate is separated along the separation layer, so that a semiconductor layer containing the second halogen is provided over the support substrate.

19 Claims, 21 Drawing Sheets

SEMICONDUCTOR SUBSTRATE, SEMICONDUCTOR DEVICE AND MANUFACTURING METHOD THEREOF

BACKGROUND OF THE INVENTION

1. Field of the Invention

The present invention relates to a semiconductor substrate having a silicon-on-insulator (SOI) structure where a thinned crystalline semiconductor layer is provided on an insulating substrate. The present invention particularly relates to a bonding SOI technique and also relates to a semiconductor substrate which is obtained by providing a crystalline semiconductor layer for a substrate having an insulating surface using glass or the like. The present invention further relates to a semiconductor device using such a semiconductor substrate or a method for manufacturing the semiconductor device.

2. Description of the Related Art

Instead of a silicon wafer that is formed by thinly slicing an ingot of a single crystal semiconductor manufactured by a Czochralski (CZ) method or the like, a semiconductor substrate called a silicon-on-insulator substrate (SOI substrate) has been developed, in which a thin single crystal semiconductor layer is provided over a substrate having an insulating surface.

As a typical method for manufacturing an SOI substrate, a hydrogen ion implantation separation method is known (for example, see Reference 1: U.S. Pat. No. 6,372,609). A hydrogen ion implantation separation method is a method in which hydrogen ions are implanted into a silicon wafer, whereby a microbubble layer is formed in a region at a predetermined depth from a surface of the silicon wafer; the surface into which the hydrogen ions are implanted is superposed on another silicon wafer; and heat treatment is performed to separate the silicon wafer using the microbubble layer as a cleavage plane, so that a thin single crystal silicon layer (SOI layer) that is bonded to the another silicon layer is formed. In accordance with this method, in addition to heat treatment by which an SOI layer that is a surface layer is separated, heat treatment is required to be performed in the reducing atmosphere at 1000° C. to 1300° C. in order to increase the bonding strength.

Further, since parasitic capacitance of a transistor can be reduced with the use of the SOI substrate, formation of an integrated circuit using the transistor has been expected to be effective for improvement of operation speed and reduction in consumption power. For example, a fully-depletion field effect transistor that includes a ultrathin SOI layer is disclosed (see Reference 2: Japanese Published Patent Application No. H11-284201).

SUMMARY OF THE INVENTION

In order to obtain a single crystal silicon layer by separation of a single crystal silicon layer of a surface layer of a silicon wafer by a hydrogen ion implantation method, heat treatment is needed to be performed at a high temperature of 600° C. or higher. However, when a glass substrate that is used in a liquid crystal panel for reducing substrate cost is used as a support substrate and a single crystal silicon layer is bonded to the glass substrate, so that an SOI substrate is formed, a problem arises in that warpage of a glass substrate occurs when heat treatment is conducted at high temperature. When the glass substrate warps, the bonding strength between the glass substrate and the single crystal silicon layer is reduced. In addition, in bonding the single crystal silicon layer to the glass substrate, impurities such as metal which are diffused from the glass substrate contaminates the single crystal silicon layer. Consequently, the conventional technique has a problem that even when a single crystal silicon layer is provided over the glass substrate and a transistor is formed using the single crystal silicon layer, sufficient characteristics cannot be obtained.

On the other hand, a semiconductor integrated circuit has been developed with miniaturization of design rules as an indicator of research and development. In recent years, a technique in which a semiconductor integrated circuit is manufactured under the design rules of 100 nm or less is realized. However, in accordance with the progress of miniaturization of the design rules, new problems are caused and they are problems to be solved. Since it is necessary to keep threshold voltage of a transistor and to shorten the gate length for miniaturization, it is necessary to increase impurity concentration of a channel-forming region formed between source and drain regions. However, along with this, there is a problem in that the junction electric field between a channel formation region and the source and drain regions is increased, so that junction leakage current becomes increased.

In view of the foregoing problems, it is an object of the present invention to provide a method for manufacturing a semiconductor substrate in which contamination of a semiconductor layer due to an impurity is prevented and the bonding strength between a support substrate and the semiconductor layer can be increased, even when a support substrate with low upper temperature limit, such as a glass substrate, is used. It is another object to provide a method for manufacturing a semiconductor device in which junction leakage current can be reduced using such a semiconductor substrate.

In the present invention, an oxide film containing first halogen is formed on a surface of a single crystal semiconductor substrate; the single crystal semiconductor substrate is irradiated with ions of second halogen, whereby a separation layer is formed in the single crystal semiconductor substrate, and the second halogen is contained in the single crystal semiconductor substrate; heat treatment is performed in a state in which the single crystal semiconductor substrate and a support substrate having an insulating surface are superposed with each other with an insulating film containing hydrogen interposed therebetween; and a part of the single crystal semiconductor substrate is separated along the separation layer. As a result, a single crystal semiconductor layer that contains the second halogen and is bonded to the support substrate having an insulating surface is provided.

Further, a field effect transistor formed using the single crystal semiconductor layer that contains the second halogen and is bonded to the support substrate having an insulating surface is used for a semiconductor device. The halogen contained in the single crystal semiconductor layer is distributed such that concentration thereof becomes higher toward a surface (surface opposite to the support substrate side) of the single crystal semiconductor layer. In other words, in the structure of the field effect transistor, concentration of the halogen is increased in boundary regions, which are close to be on a gate electrode side, of the following regions formed in the single crystal semiconductor layer: a source region; a drain region; impurity semiconductor regions adjacent to the source and drain regions; and a channel formation region. A first insulating layer containing halogen, a second insulating layer containing nitrogen, and a third insulating layer containing hydrogen are provided between the single crystal semiconductor layer and the support substrate.

When an oxide film containing halogen is provided between the single crystal semiconductor layer and the support substrate by oxidizing the semiconductor substrate directly in an atmosphere containing halogen, defect level density at an interfere between the single crystal semiconductor layer and the oxide film can be reduced, and adhesion between the single crystal semiconductor layer and a blocking layer can be improved. Further, a blocking layer is formed using an insulating film containing nitrogen, whereby the single crystal semiconductor layer can be prevented from being contaminated due to an impurity. A bonding layer provided between the blocking layer and the support substrate is formed using a silicon oxide film containing hydrogen (and/or an OH group), whereby stress can be reduced. Therefore, thermal stress that is added to the single crystal semiconductor layer unintentionally can be reduced. Further, in a case where external stress is added to the single crystal semiconductor layer, resistance against separation derived from external stress can be improved by dispersing the external stress.

In a structure of a field effect transistor, concentration of halogen is increased in boundary regions, which are close to be on a gate electrode side, of the following regions formed in the single crystal semiconductor layer: a source region; a drain region; impurity semiconductor regions adjacent to the source and drain regions; and a channel formation region. As a result, junction leakage current can be reduced. Further, the interface level density in the channel formation region is decreased in accordance with such a structure, and a semiconductor device having steep rise electric characteristics and excellent hot carrier resistance can be obtained.

DETAILED DESCRIPTION OF THE INVENTION

Figure 1A:
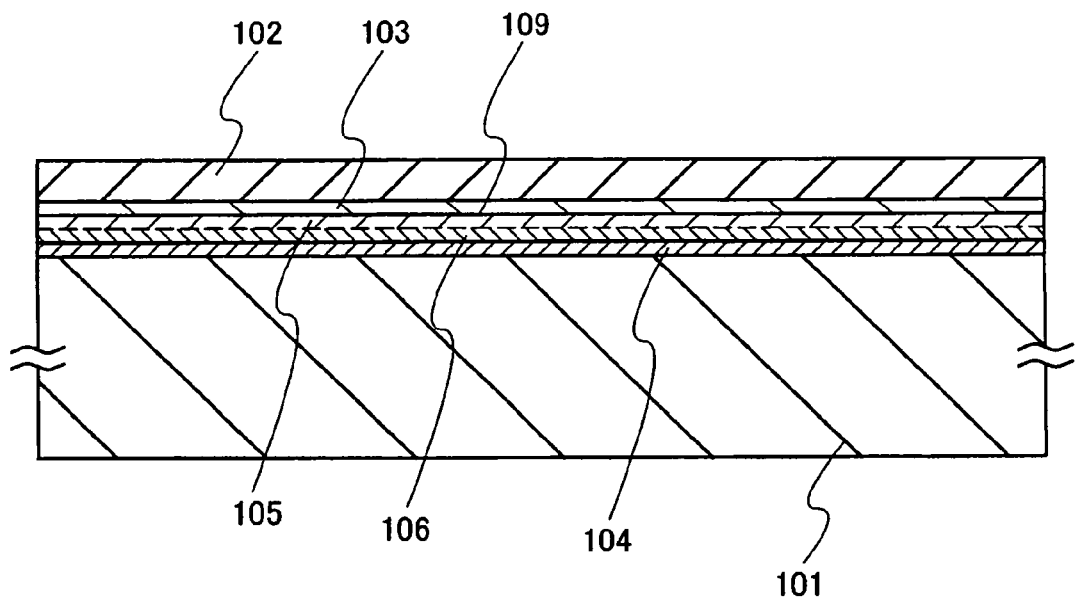
FIGS. 1A and 1B are cross-sectional views each showing a structure of a substrate having an SOI structure.

Embodiment modes of the present invention will be described below with reference to the accompanying drawings. Note that the present invention is not limited to the description below, and it is easily understood by those skilled in the art that modes and details can be modified in various ways without departing from the purpose and the scope of the present invention. Accordingly, the present invention should not be interpreted as being limited to the description of the embodiment modes below. Note that like portions in the drawings may be denoted by the like reference numerals in structures of the present invention.

In description below, a case in which a single crystal semiconductor layer is provided over a substrate having an insulating surface or an insulating substrate is described. However, by using a different kind of a semiconductor substrate that is to be a base of a semiconductor layer, a polycrystal semiconductor layer can be fixed over the substrate having an insulating surface or the insulating substrate.

Embodiment Mode 1

Figure 1B:
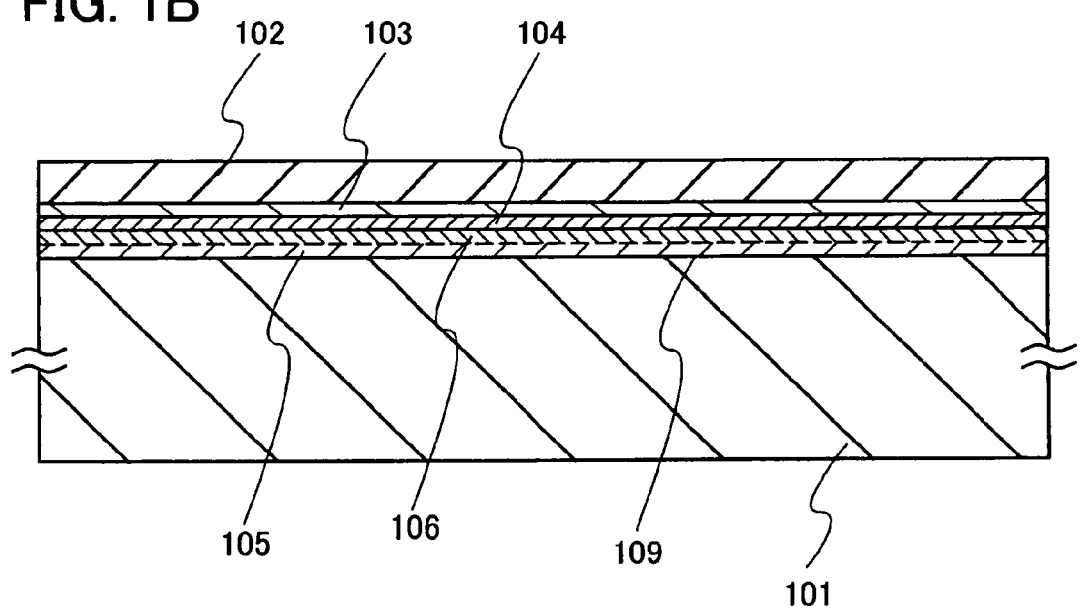

FIGS. 1A and 1B each show a structure of a substrate having an SOI structure in accordance with this embodiment mode. FIG. 1A shows a structure in which a single crystal semiconductor layer 102 provided with an oxide film 103 and a blocking layer 109 and a support substrate 101 are bonded with a bonding layer 104 interposed therebetween. In FIG. 1A, the support substrate 101 is a substrate having an insulating property or an insulating surface, and a glass substrate (also referred to as a non-alkali glass substrate) is applied, which is used for electronics industry using aluminosilicate glass, aluminoborosilicate glass, and barium borosilicate glass. In other words, a glass substrate can be applied, which has a thermal expansion coefficient of $25\times10^{-7}/°$ C. to $50\times10^{-7}/°$ C. (preferably, $30\times10^{-7}/°$ C. to $40\times10^{-7}/°$ C.) and a strain point of 580° C. to 680° C. (preferably, 600° C. to 680° C.). In addition, a quartz substrate, a ceramic substrate, a metal substrate of a surface which is covered with an insulating film, or the like can be applied.

The single crystal semiconductor layer 102 is formed using a crystalline semiconductor substrate. For example, the single crystal semiconductor layer 102 can be formed by an ion implantation separation method, by which the crystalline semiconductor substrate is irradiated with hydrogen ions or fluoride ions accelerated in the electric field to implant the ions into a predetermined depth from a surface of the crystalline semiconductor substrate; and thereafter, heat treatment is performed, so that a single crystal semiconductor layer, which is a surface layer, is separated. Silicon or germanium can be used for the crystalline semiconductor substrate. In addition, a substrate using a compound semiconductor such as silicon germanium, silicon carbide, gallium arsenide, gallium nitride, gallium phosphide, or indium phosphide may be employed. The crystalline semiconductor layer 102 has a thickness of 5 to 500 nm, preferably, 10 to 200 nm.

Note that "to implant (including implantation, implanted, implanting, and the like)" of ions in this specification means that by irradiating a semiconductor substrate with accelerated ions, an element constituting the ions is contained in the semiconductor substrate. For example, such a process includes ion doping. Further, "separation layer" means a fragile region in which a crystalline structure is disordered and microvoids are produced by impact of when the semiconductor substrate is irradiated with ions accelerated by electric field and the ions are implanted to the semiconductor substrate. Then, the semiconductor substrate is separated along the separation layer by heat treatment performed thereafter, so that a part of the semiconductor substrate can be left over a support substrate as a semiconductor layer.

The oxide film 103 is provided as a first insulating layer on a surface of the single crystal semiconductor layer 102, which is on the support substrate 101 side. The oxide film 103 is formed by oxidizing a semiconductor substrate that is to be a base of the single crystal semiconductor layer 102. The first insulating layer preferably contains halogen. Accordingly, defects at an interface between the single crystal semiconductor layer 102 and the oxide film 103 are compensated, and localized level density can be reduced. In other words, when the oxide film 103 contains halogen, the interface between the oxide film 103 and the single crystal semiconductor layer 102 is inactivated so that electric characteristics become stable. Further, halogen reacts with an impurity such as metal contained in the single crystal semiconductor substrate that is a base of the single crystal semiconductor layer 102, and the metal reacted with halogen gets out into the air, so that the metal can be removed. In order that the oxide film 103 contains halogen, heat treatment of the single crystal semiconductor substrate may be performed in an oxidizing atmosphere containing halogen. For example, a halogen gas is added to an oxygen gas, and heat treatment is performed at a temperature of from 900° C. to 1150° C. (typically 1000° C.), whereby the oxide film 103 is formed. HCl is a typical example as a halogen gas, and in addition, one ore more kinds of gases selected from HF, $NF_3$, HBr, $Cl_2$, $ClF_3$, $BCl_3$, $F_2$, $Br_2$, dichloroethylene, and the like can be applied.

Further, the blocking layer 109 containing nitrogen is provided as a second insulating layer in contact with the oxide film 103. As the blocking layer 109, a single layer of a single structure or a plurality of films of a stacked structure of a silicon nitride film, a silicon nitride oxide film, a silicon oxynitride film, an aluminum nitride film, and/or an aluminum nitride oxide film is applied.

FIG. 1A illustrates a structure in which a silicon nitride oxide film 105 and a silicon oxynitride film 106 are provided in this order from the oxide film 103 side, as an example of the blocking layer 109. An impurity such as metal contained in the support substrate 101 adversely affects characteristics of a semiconductor element such as a transistor formed using a single crystal semiconductor layer when the impurity diffuses. On the other hand, the silicon nitride oxide film 105 has a function of preventing an impurity from diffusing to the single crystal semiconductor layer 102 side. In addition, the silicon oxynitride film 106 has a function of reducing internal stress of the silicon nitride oxide film 105. By providing the blocking layer 109 having such a stack structure, the single crystal semiconductor layer 102 is prevented from being contaminated by an impurity and stress distortion can be eased. Further, in a case where the blocking layer 109 is provided closer to the single crystal semiconductor layer 102 side than the bonding layer 104 is, the semiconductor substrate that is a base of the single crystal semiconductor layer 102 and the support substrate 101 are bonded with the bonding layer 104 after the blocking layer 109 is formed, whereby the blocking layer 109 can be formed without concentration of the upper temperature limit of the support substrate 101.

The bonding layer 104 forming a smooth surface is provided as a third insulating layer between the blocking layer 109 and the support substrate 101. The third insulating layer contains hydrogen (and/or an OH group). As such a bonding layer 104, an insulating layer formed by thermal or chemical reaction is preferably used. For example, an oxide film formed by thermal or chemical reaction is suitable. A film formed by chemical reaction as main reaction is preferable because smoothness of a surface can be secured. The bonding layer 104 forming a smooth surface is preferably provided with a thickness of 1 to 500 nm. This thickness makes it possible to smooth roughness of a surface of a film to be formed (a surface that forms bonding) and to secure smoothness of a growth surface of the film.

As a preferable example of the bonding layer 104, a silicon oxide film which is deposited by a chemical vapor deposition method can be used. In this case, a silicon oxide film formed using an organic silane gas by a chemical vapor deposition method is preferably used. As the organic silane gas, a silicon-containing compound such as tetraethoxysilane (TEOS: chemical formula, $Si(OH_2H_5)_4$), tetramethylsilane (chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used. The bonding layer 104 may be deposited on either side of the support substrate 101 or the single crystal semiconductor layer 102 or both sides of the support substrate 101 and the single crystal semiconductor layer 102. In accordance with such a bonding layer 104, stress distortion between the single crystal semiconductor layer 102 and the support substrate 101 is eased, and thus bonding strength can be increased. Further, stress distortion of the single crystal semiconductor layer 102 is eased, and crystallinity can be favorably kept.

The bonding layer 104 is provided between the blocking layer 109 and the support substrate 101, and they are made in close contact with each other. In this way, bonding can be performed even in a room temperature. When the support substrate 101 and the single crystal semiconductor layer 102 are pressed, the bonding by close contact can be made stronger. The bonding by close contact is formed by attractive force between the surfaces, and thus a more preferred mode can be obtained by adding treatment in which many hydrophilic groups are attached to the surfaces to form a bond. For example, it is preferable that the surface (on the surface side in contact with the bonding layer 104) of the support substrate 101 be subjected to oxygen plasma treatment or ozone treatment to have a hydrophilic property. In the case of adding the treatment by which the surface is made to have a hydrophilic property in this manner, hydroxyl groups on the surface act to form a bond due to hydrogen bond. Further, the surfaces to form a bond are cleaned and the surfaces are made in contact with each other to form a bond, and the bond is subjected to heat treatment at a room temperature or higher, so that the bond can be strengthened.

As a pretreatment of the surface of the bonding layer 104 and/or a surface to be in contact with the bonding layer 104, it is effective that the surface/surfaces may be irradiated with an ion beam using an inert gas such as argon so as to be cleaned. By the ion beam irradiation, dangling bonds are exposed on the surface of the bonding layer 104 and/or the surface of the side in contact with the bonding layer 104, and the surface/surfaces becomes/become very active. In this way, when activated surfaces are made in close contact with each other, a bond can be formed even at a low temperature. In the method of forming a bond by activating surfaces, since it is required to keep the surfaces in a highly clean state, the method is preferably carried out in vacuum.

The single crystal semiconductor layer 102 contains halogen selected from fluorine, chlorine, bromine, or the like belonging to Group 17 of the periodic table. Halogen has a function of terminating dangling bonds in hole defects of the single crystal semiconductor layer 102. In addition, halogen has a function of terminating defects due to dangling bonds in the single crystal semiconductor layer 102 and on a surface thereof to be inactivated. In a manufacturing process of such a filed effect transistor, treatment in which hydrogen is diffused in the single crystal semiconductor layer 102 to terminate dangling bonds is performed. At this time, hydrogen easily gets out of silicon in the single crystal semiconductor layer 102 even by heat treatment of approximately 400° C. On the other hand, bond energy of silicon and halogen such as fluorine or chlorine is higher than that of silicon and hydrogen; therefore, halogen can be stably contained in the single crystal semiconductor layer 102. For example, while the bond energy of H—Si is about 3.1 eV, the bond energy of F—Si is 5.59 eV, and the bond energy of Cl—Si is 4.72 eV.

Figure 2:
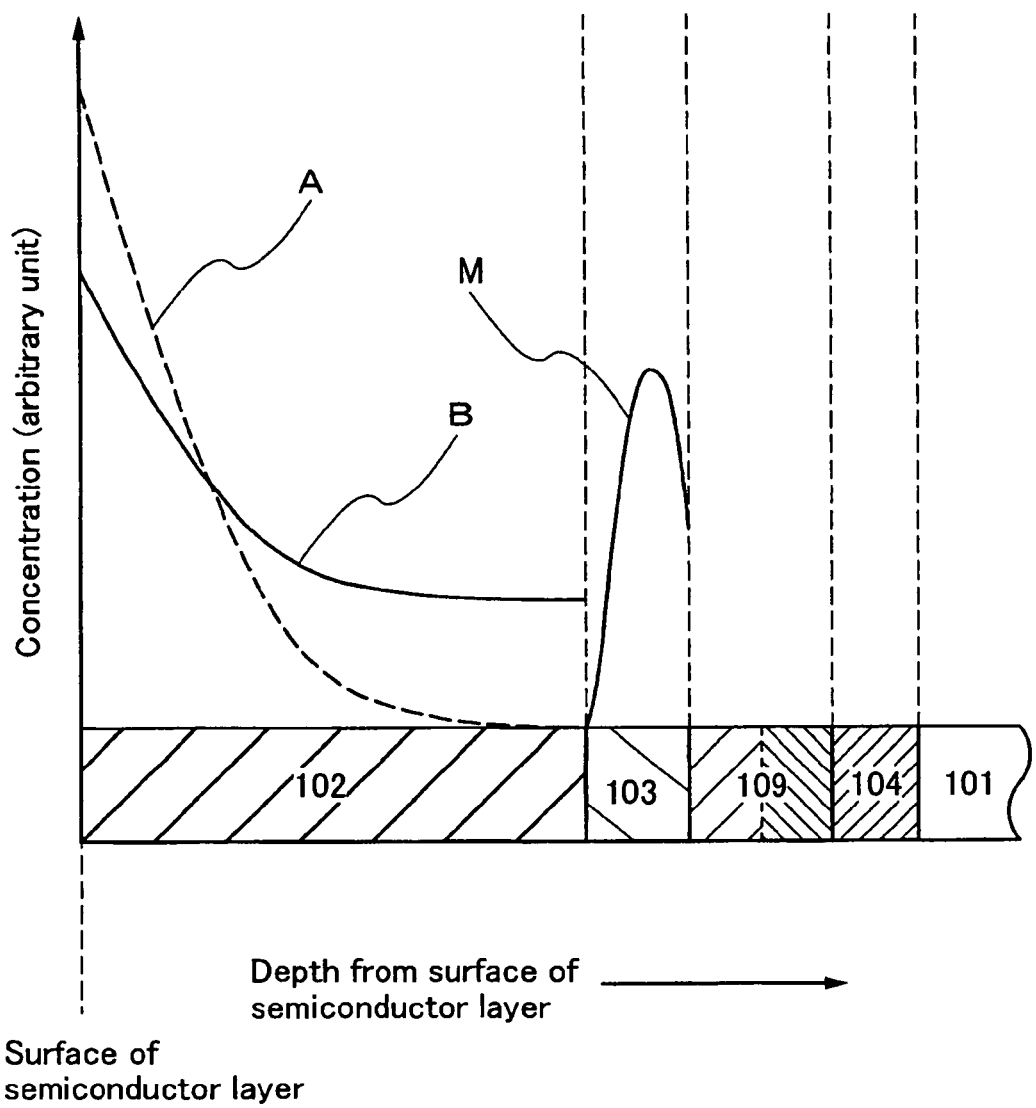
FIG. 2 is a graph schematically describing distribution of halogen in a single crystal semiconductor layer.

Distribution of halogen in the single crystal semiconductor layer is schematically described with reference to FIG. 2. Although halogen may be distributed uniformly in the single crystal semiconductor layer 102, halogen may be distributed such that concentration thereof can be increased toward the surface of the single crystal semiconductor layer 102 (the opposite surface to the support substrate 101 side) as shown by a curved line B of FIG. 2. This distribution may be close to Gaussian distribution generated when ions having kinetic energy are implanted into a semiconductor layer. In accordance with such distribution, defects in boundary regions of the following regions: a source region; a drain region; impurity semiconductor regions adjacent to the source and drain regions; and a channel formation region, can be repaired by halogen in a structure of the filed effect transistor.

The oxide film 103 containing halogen captures heavy metal that is an extrinsic impurity and has effect of preventing the single crystal semiconductor layer 102 from being contaminated. A typical heavy metal includes Fe, Cr, and Ni, and furthermore, may include Mo as the heavy metal. These heavy metals are often introduced in a process in which halogen is contained in the single crystal semiconductor layer 102. FIG. 2 shows a mode in which heavy metal is contained in the oxide film 103 (a curved line M). In other words, the oxide film 103 that is formed by oxidation in a HCl atmosphere or the like contains halogen, and the halogen has a function of gettering an impurity such as heavy metal adversely affecting the single crystal semiconductor layer 102. By heat treatment performed after the oxide film 103 is formed, the metal as an impurity contained in the single crystal semiconductor layer 102 is separated out to the oxide film 103 and reacted with halogen (e.g., chlorine) to be captured. Accordingly, the impurity captured in the oxide film 103 is confined, whereby contamination of the single crystal semiconductor layer 102 can be prevented. That is, the oxide film 103 captures metal that is to be the lifetime killer in the single crystal semiconductor layer 102 so as not to make the metal to be diffused, thereby contributing high purity of the single crystal semiconductor layer 102.

FIG. 1B illustrates a structure in which the blocking layer 109 and the bonding layer 104 are provided on the support substrate 101 side, and the single crystal semiconductor layer 102 provided with an oxide film 103 and the support substrate 101 are bonded. FIG. 1B illustrates a structure in which a silicon nitride oxide film 105 and a silicon oxynitride film 106 are formed in this order from the support substrate 101 side as an example of the blocking layer 109.

Even a glass substrate used in the electronics industry, such as an aluminosilicate glass substrate, an aluminoborosilicate glass substrate, and a barium borosilicate glass substrate (also referred to as a non-alkali glass substrates) contains a small amount of an impurity of an alkali metal such as sodium, or the like. Therefore, if a glass substrate is used for the support substrate 101, the small amount of the impurity diffuses, so that characteristics of a semiconductor element such as a transistor formed using a single crystal semiconductor layer are adversely affected. On the other hand, the silicon nitride oxide film 105 has a function of preventing the impurity such as metal contained in the support substrate 101 from diffusing to the single crystal semiconductor layer 102 side.

Further, in FIG. 1B, since the silicon nitride oxide film 105 is provided between the bonding layer 104 and the support substrate 101, the single crystal semiconductor layer 102 can be prevented from being contaminated by an impurity diffused from the support substrate 101, and further, the bonding layer 104 can also be prevented from being contaminated. Therefore, decrease of the bonding strength due to the impurity can be prevented. Furthermore, the silicon oxynitride silicon film 106 has a function of reducing internal stress of the silicon nitride oxide film 105.

The oxide film 103 provided for the single crystal semiconductor layer 102 is formed by oxidizing a semiconductor substrate that is a base of the single crystal semiconductor layer 102 and preferably contains halogen. By containing halogen, defects at the interface between the single crystal semiconductor layer 102 and the oxide film 103 are compensated, so that the local level density at the interface can be reduced. Thus, the interface between the single crystal semiconductor layer 102 and the oxide film 103 is inactivated, so that electric characteristics become stable. In addition, halogen is reacted with an impurity such as metal contained in the single crystal semiconductor substrate serving as a base of the single crystal semiconductor layer 102, and the metal reacted with halogen gets out into the air, so that the metal can be removed. Furthermore, halogen contained in the oxide film 103 has a function of capturing a heavy metal that is an extrinsic impurity and thus preventing the singly crystalline semiconductor layer 102 from being contaminated.

Similarly to FIG. 1A, the single crystal semiconductor layer 102 in FIG. 1B contains halogen selected from fluorine, chlorine, bromine, or the like belonging to Group 17 of the periodic table. Halogen has a function of terminating dangling bonds in hole defects of the single crystal semiconductor layer 102. In addition, halogen has a function of terminating defects due to dangling bonds in the single crystal semiconductor layer 102 and on a surface thereof to be inactivated.

The bonding layer 104 forming a smooth surface is provided between the oxide film 103 and the silicon oxynitride silicon film 106. As a preferable example of the bonding layer 104, a silicon oxide film deposited by a chemical vapor deposition method can be used. The bonding layer 104 is interposed between the oxide film 103 and the silicon oxynitride film 106, and they are in close contact with each other, thereby forming a bond even at a room temperature. Further, by pressing the support substrate 101 and the single crystal semiconductor layer 102, bonding by close contact can be further strengthened. Formation of bonding by the bonding layer 104 is similar to that in FIG. 1A.

By employing the structures of FIGS. 1A and 1B, the single crystal semiconductor layer 102 can be prevented from being contaminated by an impurity. In addition, the local level density at the interface on the bonding layer 104 side of the single crystal semiconductor layer 102 can be decreased. A semiconductor element typified by a transistor can be formed using the single crystal semiconductor layer 102 described above.

Next, a method for manufacturing a substrate having an SOI structure described above is described with reference to FIGS. 3A to 5B.

Figure 3A:
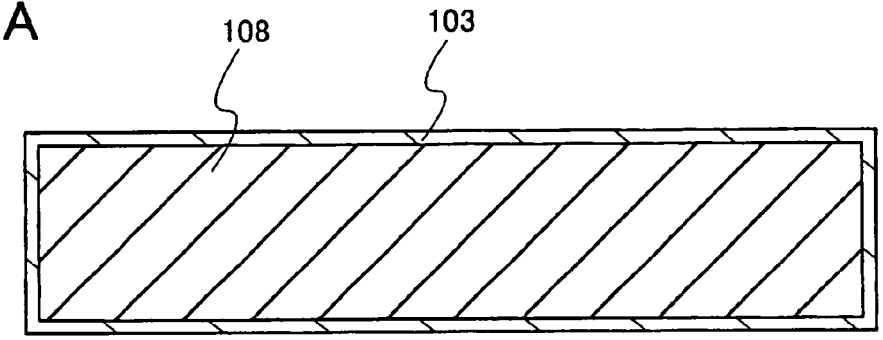
FIGS. 3A to 3C are cross-sectional views illustrating a method for manufacturing a substrate having an SOI structure.

In FIG. 3A, as a semiconductor substrate 108, a p-type or an n-type single crystal silicon substrate (silicon wafer) is typically used. The semiconductor substrate 108 is washed using a sulfuric acid/hydrogen peroxide mixture (SPM), an ammonium hydroxide/hydrogen peroxide mixture (APM), a hydrochloric acid/hydrogen peroxide mixture (HPM), dilute hydrofluoric acid (DHF), or the like as appropriate. Then, the semiconductor substrate 108 is subjected to thermal oxidation. As thermal oxidation, dry oxidation may be performed; however, thermal oxidation in an oxidizing atmosphere in which halogen is added is preferably performed. HCl is a typical example as a halogen gas, and in addition, one ore more kinds of gases selected from HF, $NF_3$, HBr, $Cl_2$, $ClF_3$, $BCl_3$, $F_2$, $Br_2$, dichloroethylene, and the like can be applied. For example, thermal oxidation may be performed at a temperature of 900° C. to 1150° C. (typically, at 1000° C.) in an atmosphere containing HCl (hydrogen chloride) at 0.5 to 10 volume % (preferably 3 volume %) with respect to oxygen. The processing time may be assumed as 0.1 to 6 hours, preferably 0.5 to 1 hour. The film thickness of the formed oxide film is 10 to 1000 nm, preferably 50 to 200 nm, for example, 100 nm in this embodiment mode.

Heat treatment is performed within such a temperature range, so that a gettering effect by halogen to the semiconductor substrate 108 can be obtained. Gettering has an effect of removing an impurity such as metal, in particular. For example, if HCl is used as a halogen gas, an impurity such as metal contained in the semiconductor substrate 108 turns into a volatile chloride, gets out into the air, and is removed by an operation of chlorine. Gettering using halogen is effective when the surface of the semiconductor substrate 108 is subjected to chemical mechanical polishing (CMP). In addition, hydrogen has a function of compensating defects at an interface between the semiconductor substrate 108 and the oxide film 103 so as to reduce a local level density of the interface.

The oxide film 103 is formed by such thermal oxidation, so that halogen can be contained in the oxide film 103. When halogen is contained in the oxide film 103 at a concentration of $1\times10^{17}$ atoms/cm$^3$ to $5\times10^{20}$ atoms/cm$^3$, the halogen captures an impurity such as metal; accordingly, the oxide film 103 can have a function as a protective film and prevents contamination due to an impurity such as metal included in the semiconductor substrate 108.

Figure 3B:
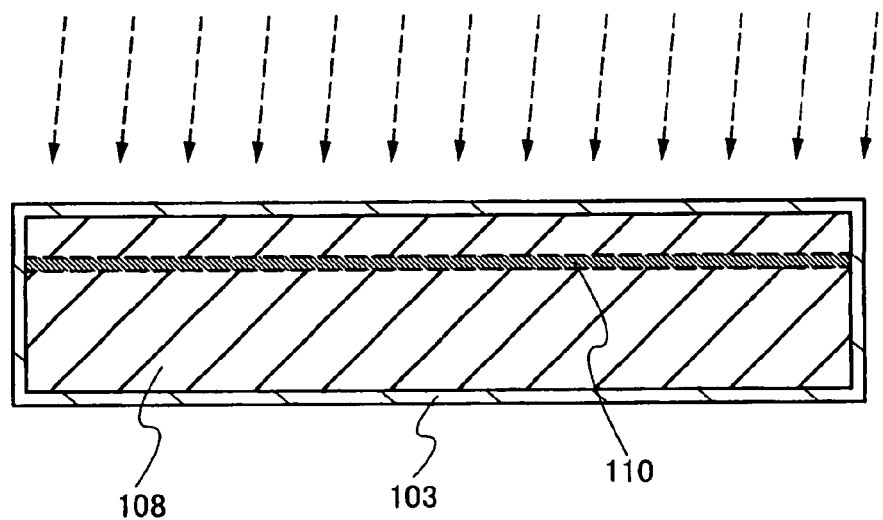

In FIG. 3B, hydrogen ions or halogen ions are implanted to form a separation layer 110 in the semiconductor substrate 108. The separation layer 110 is formed in a region at a predetermined depth from a surface of the semiconductor substrate 108 by irradiating the semiconductor substrate 108 with ions accelerated in an electric field. The depth of the separation layer 110 from the surface of the semiconductor substrate 108 can be controlled by accelerated energy of the ions and an incident angle of the ions.

Figure 6:
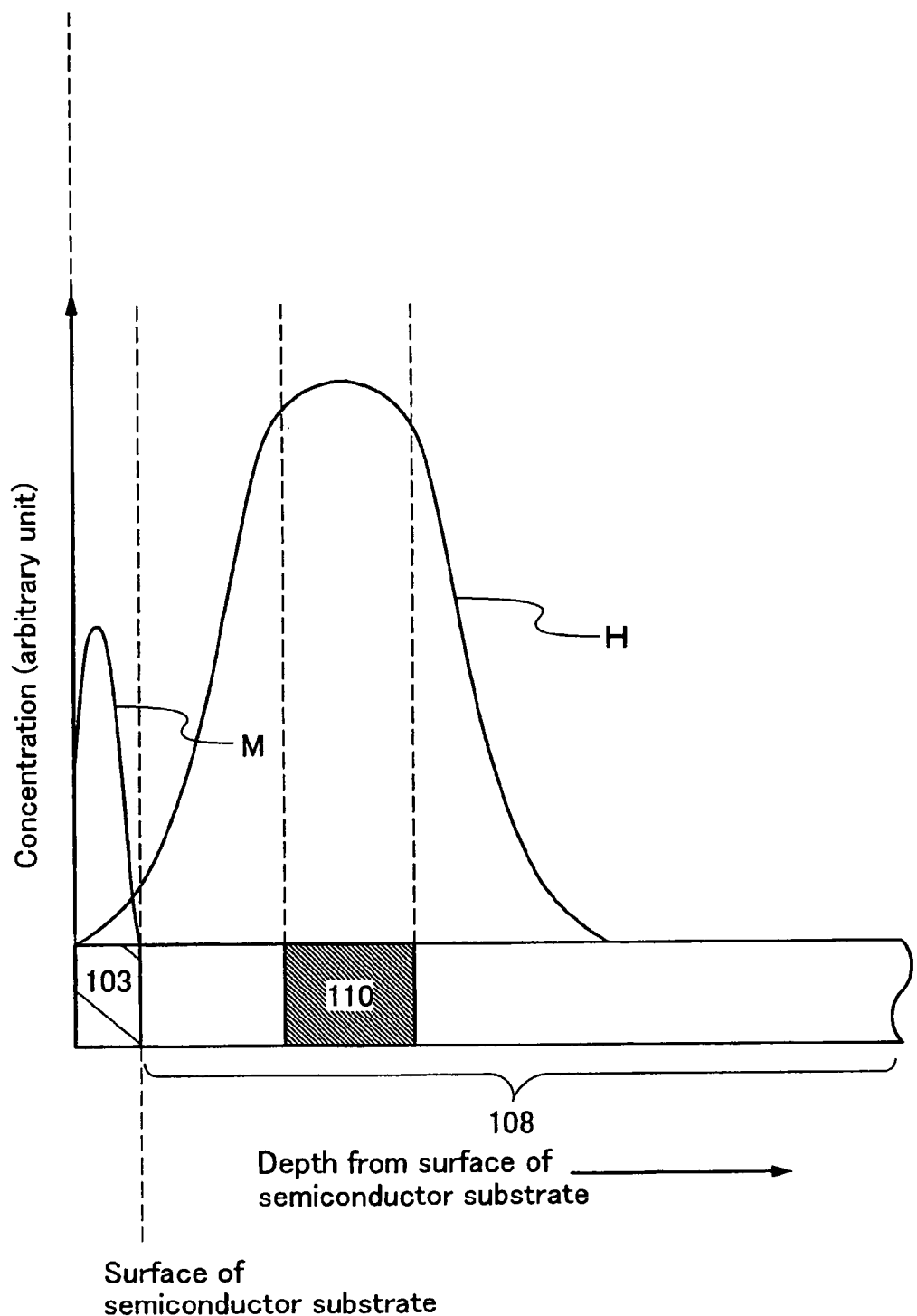
FIG. 6 is a graph schematically describing distribution of halogen in a semiconductor substrate.

FIG. 6 schematically shows distribution of the halogen ions in the semiconductor substrate 108 as a curved line H. Distribution of the halogen ions implanted into the semiconductor substrate 108 is Gaussian distribution. The separation layer 110 is formed in a region at a depth close to an average depth to which ions are implanted, from the surface of the semiconductor substrate 108. For example, the thickness of the semiconductor substrate 108 is 5 to 500 nm, preferably 10 to 20 nm, and an accelerating voltage in implantation of ions is set in consideration of such a thickness. As a matter of course, when the semiconductor substrate 108 is irradiated with ions accelerated in an electric field, distribution of ions becomes substantially Gaussian distribution with a peak at a certain depth, and the peak position is used as an indication of the depth region where the separation layer 110 is formed.

The ion implantation is preferably conducted with an ion doping apparatus. In other words, a doping apparatus for implanting plural ion species which are generated by making a source gas into plasma and which are not subjected to mass separation, is used. In this embodiment mode, it is preferable that one kind of ions or plural kinds of ions having different masses of the same atom be implanted. In the ion doping, the accelerating voltage may be 10 kV to 100 kV, and preferably 30 kV to 80 kV; the dose may be $1\times10^{16}$ ions/cm$^2$ to $4\times10^{16}$ ions/cm$^2$; and the beam current density may be equal to or grater than 2 µA/cm$^2$, preferably equal to or greater than 5 µA/cm$^2$, and more preferably equal to or greater than 10 µA/cm$^2$. Note that the term "ion doping" in this specification means a system in which an object is irradiated with ions which are generated from a source gas and are accelerated in an electric field, without being subjected to mass separation.

As the halogen ions to be implanted, ions of fluorine, chlorine, or bromide are applied. As a gas supplied to a doping apparatus in order to obtain the halogen ions, HF, $NF_3$, HBr, $Cl_2$, $ClF_3$, $BCl_3$, $F_2$, $Br_2$, or the like is applied. Since a fluorine ion particularly has a small mass number, when the fluorine ions are implanted into the semiconductor substrate 108 as the halogen ion, damage given to crystals is small. The separation layer 110 formed in the semiconductor substrate 108 by implanting the halogen ions contains halogen of $1\times10^{20}$ atoms/cm$^3$ (preferably, $5\times10^{20}$ atoms/cm$^3$) or more. In the region of the semiconductor substrate 108 where halogen is locally implanted at high concentration, a crystalline structure is disordered and microvoids are formed, so that the separation layer 110 can have a porous structure. In this case, volume of the microvoids formed in the separation layer 110 is changed by heat treatment at the relatively low temperature, and the semiconductor substrate 108 is cleaved along the separation layer 110, whereby a thin single crystal semiconductor layer can be formed.

Note that in this specification, "to cleave (including cleavage, cleaved, cleaving, and the like)" means that a part of a semiconductor substrate is separated along a separation layer in order to form a semiconductor layer on a support substrate.

Hereinafter, in this specification, "to cleave" is expressed by "to separate (including separation, separated, separating, and the like)".

Further, in this step, hydrogen ions may be implanted at the same time or before and after the semiconductor substrate 108 is irradiated with the halogen ions. In the case of implantation with hydrogen ions, it is preferable that $H^+$, $H_2^+$, and $H_3^+$ ions be contained and the proportion of $H_3^+$ ions be made higher than that of $H^+$, and $H_2^+$ ions. By making the rate of $H_3^+$ ions higher, implantation efficiency can be increased and the time for ion irradiation can be shortened.

When the semiconductor substrate 108 is irradiated with ions which are not subjected to mass separation using an ion doping apparatus, metal ions are implanted into the semiconductor substrate 108, in addition to halogen ions or hydrogen ions, at the same time. The metal ions have large mass numbers and therefore, they are distributed mostly on a surface of the semiconductor substrate 108 side where the ions are implanted. In this mode, the oxide film 103 is formed on a surface of the semiconductor substrate 108. When this oxide film 103 is formed thickly so as not to intrude the metal ions into the semiconductor substrate 108, expansion of distribution of the metal can be suppressed within the oxide film 103 (a curved line M shown in FIG. 6). When the oxide film 103 is formed by oxidation in an atmosphere containing HCl, an impurity such as a heavy metal adversely affecting the semiconductor substrate 108 can be gettered by halogen contained in the oxide film 103. Accordingly, since the impurity captured in the oxide film 103 is confined in the oxide film 103, contamination of the semiconductor substrate 108 can be prevented.

Even when the ions are subjected to mass separation and implanted to the semiconductor substrate 108, the separation layer 110 can be formed similarly. In this case also, it is preferable that $H_3^+$ ions be more implanted to the semiconductor substrate 108 as selective than $H^+$, $H_2^+$ ions be.

Other than hydrogen or halogen, deuterium or an inert gas such as helium can also be selected as the gas from which ions are generated. When helium is used as a source gas and an ion doping apparatus which does not have a mass-separation function is used, an ion beam with a high proportion of $He^+$ ions can be obtained. By implanting such ions to the semiconductor substrate 108, microvoids can be formed and the separation layer 110 similar to the above can be provided in the semiconductor substrate 108.

Figure 3C:
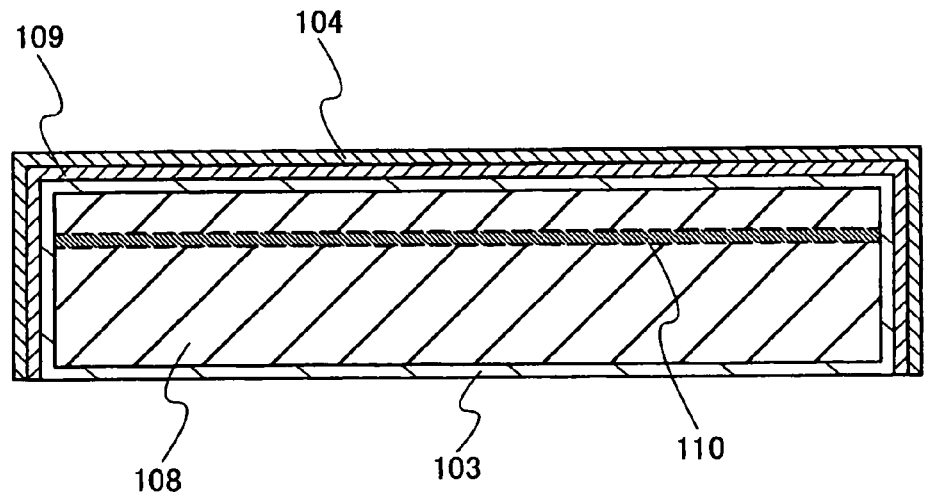

FIG. 3C shows a step in which the blocking layer 109 and the bonding layer 104 are provided for the semiconductor substrate 108 provided with the oxide film 103. As the blocking layer 109, a silicon nitride film or a silicon nitride oxide film is formed with a thickness of 50 to 200 nm by a vapor-phase growth method. For example, a silicon nitride film is formed using $SiH_4$ and $NH_3$ as a source gas by a plasma CVD method. A silicon nitride oxide film is formed using $SiH_4$, $N_2O$, and $NH_3$ as a source gas by a plasma CVD method. The blocking layer 109 has an effect of preventing diffusion of an impurity to a single crystal semiconductor layer formed using the semiconductor substrate 108. In addition, the blocking layer 109 has an effect of preventing degradation of planarity by damage to the surface of the semiconductor substrate 108 by irradiation with ions in formation of the separation layer 110. Further, in a manufacturing method through FIGS. 3A to 5B, after the blocking layer 109 is provided for the semiconductor substrate 108, the semiconductor substrate 108 and the support substrate 101 are bonded to each other. Therefore, the blocking layer 109 can be formed without considering the upper temperature limit of the support substrate 101.

A silicon oxide film is preferably formed as the bonding layer 104. The thickness of the silicon oxide film may be set at 10 to 200 nm, preferably 10 to 100 nm, and more preferably 20 to 50 nm. As the silicon oxide film, a silicon oxide film formed by chemical vapor deposition using an organic silane gas is preferable. As the organic silane gas, a silicon-containing compound such as tetraethoxysilane (TEOS: chemical formula, $Si(OH_2H_5)_4$), tetramethylsilane ($Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used. Further, a silicon oxide film formed by a chemical vapor deposition method using a silane gas can be applied. In any cases, it is preferable that a silicon oxide film containing hydrogen (and/or an OH group) be formed. Concentration of hydrogen (and/or an OH group) of the silicon oxide film used as the bonding layer 104 may be $5 \times 10^{19}$ atoms/cm$^3$ to $5 \times 10^{21}$ atoms/cm$^3$. In deposition by a chemical vapor deposition method, film formation is performed at a temperature, for example, 350° C. or lower, at which degassing of the separation layer 110 that is formed in the semiconductor substrate does not occur (a temperature at which the surface of the silicon oxide film that is formed as the bonding layer 104 is not roughened or at which a crack is not formed in the separation layer 110). When a single crystal or polycrystalline semiconductor substrate is used as the semiconductor substrate 108, in the later step, heat treatment for separating a single crystal semiconductor layer or a polycrystalline semiconductor layer from the substrate is performed at a higher temperature than the temperature at which the bonding layer 104 is formed.

In addition, in the steps of FIGS. 3B and 3C, after forming the separation layer 110, the blocking layer 109 and the bonding layer 104 may be formed. In this step, if a multi-chamber CVD apparatus is used, the blocking layer 109 and the bonding layer 104 can be sequentially formed without being exposed to the air, so that contamination due to foreign matters or potassium or sodium can be prevented.

Figure 4A:
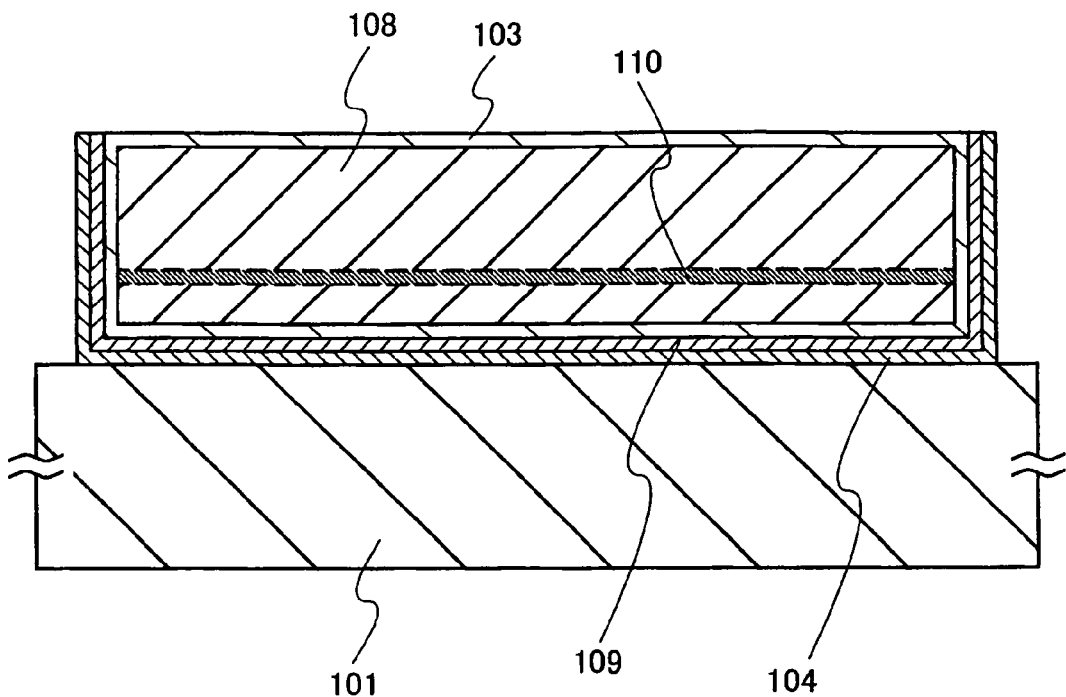
FIGS. 4A and 4B are cross-sectional views illustrating a method for manufacturing a substrate having an SOI structure.

FIG. 4A illustrates a step in which the semiconductor substrate 108 is bonded to the support substrate 101. The support substrate 101 and a surface of the bonding layer 104 provided for the semiconductor substrate 108, face each other and are in close contact with each other, so that they are bonded. Surfaces which are to form a bond are cleaned sufficiently. By locating the support substrate 101 in close contact with the bonding layer 104, the bond is formed therebetween by Van der Waals forces. By pressing the support substrate 101 and the semiconductor substrate 108 against each other, a stronger bond than the bond by Van der Waals forces can be formed by hydrogen bond.

In order to form a favorable bond, the surface/surfaces which is/are to form a bond between the bonding layer 104 and the support substrate 101 may be activated. For example, the surface/surfaces which is/are to form a bond is/are irradiated with an atomic beam or an ion beam. When an atomic beam or an ion beam is used, an inert gas neutral atom beam or inert gas ion beam of argon or the like can be used. Alternatively, plasma irradiation or radical treatment is performed. Such surface treatment makes it possible to increase bonding strength between different kinds of materials even if a later heat treatment step is performed at a temperature of 200° C. to 400° C.

Figure 4B:
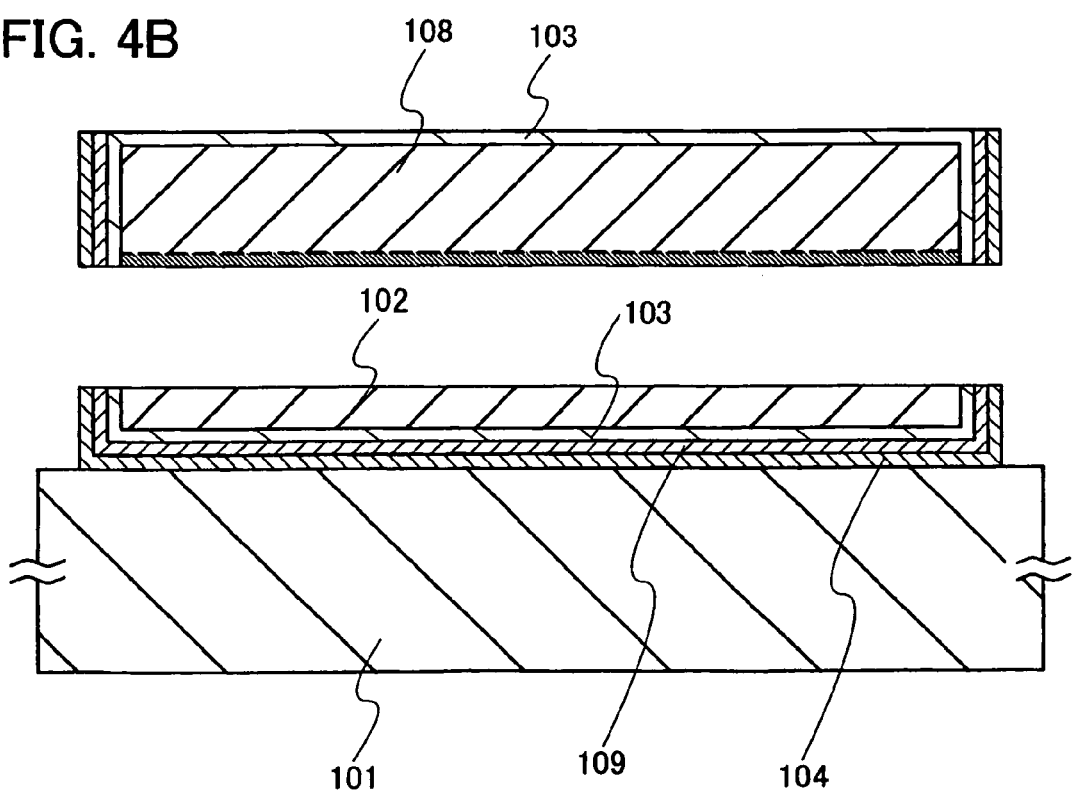

FIG. 4B illustrates a step in which the single crystal semiconductor layer 102 is obtained from the semiconductor substrate 108 by separating the semiconductor substrate 108 along the separation layer 110 heat treatment. The heat treatment is performed in a state in which the semiconductor substrate 108 and the support substrate 101 are superposed. By the heat treatment, the semiconductor substrate 108 is separated from the support substrate 101 with the single crystal semiconductor layer 102 left on the support substrate 101. The heat treatment is preferably performed at a temperature higher than or equal to the formation temperature of the bonding layer 104 and equal to or lower than a heat resistant temperature of the support substrate 101. For example, by performing the heat treatment at a temperature higher than or equal to 400° C. and lower than 600° C., the volume of microvoids formed in the separation layer 110 is changed, so that separation can be done along the separation layer 110. Since the bonding layer 104 is bonded to the support substrate 101, the single crystal semiconductor layer 102 having the same crystallinity as the semiconductor substrate 108 is left on the support substrate 101 with the single crystal semiconductor layer 102 bonded to the support substrate 101.

The single crystal semiconductor layer 102 in this state contains halogen that has been implanted to form the separation layer 110. The halogen is distributed in the single crystal semiconductor layer 102 with a concentration gradient, and the mode thereof is shown as a curved line A of FIG. 2. In accordance with the curved line A, the halogen is distributed such that the concentration thereof becomes higher toward the surface of the single crystal semiconductor layer 102 (the surface opposite to the support substrate 101 side). This is because the semiconductor substrate 108 is bonded to the support substrate 101 and separated so that the crystalline semiconductor layer 102 is left on the support substrate 101.

Figure 5A:
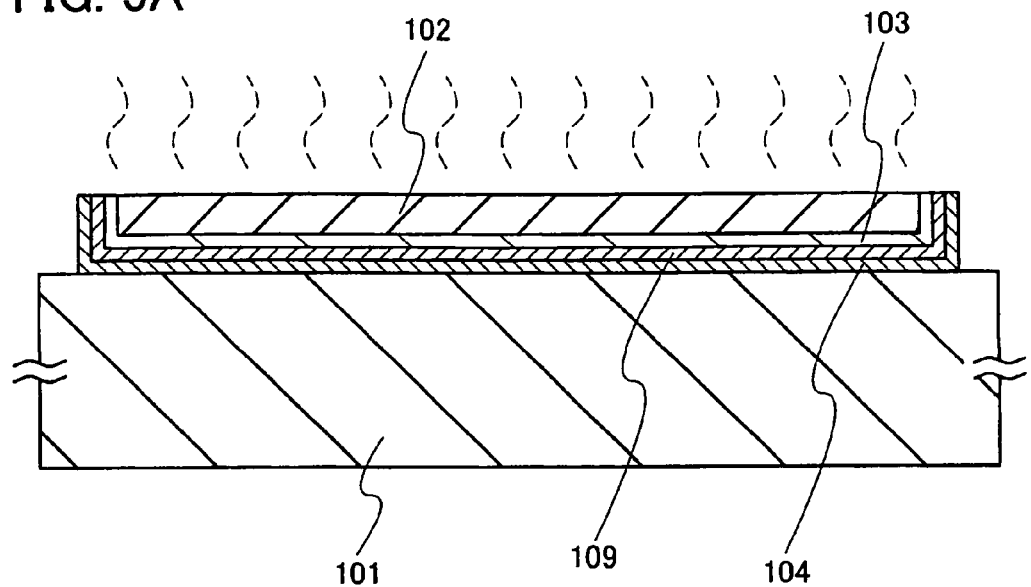
FIGS. 5A and 5B are cross-sectional views illustrating a method for manufacturing a substrate having an SOI structure.

FIG. 5A shows a step in which heat treatment is performed in a state in which the single crystal semiconductor layer 102 is fixed to the support substrate 101. By this heat treatment, the bonding strength between the support substrate 101 and the single crystal semiconductor layer 102 can be increased. That is, the hydrogen bond between the bonding surface of the support substrate 101 and the bonding surface of the single crystal semiconductor layer 102 can be changed into the covalent bond stronger than the hydrogen bond.

Further, by this heat treatment, the hydrogen or halogen that has been implanted to form the separation layer 110 gets out of the single crystal semiconductor layer 102. It is preferable that the heat treatment be performed so as to remove microvoids in the bonding portion between the support substrate 101 and the single crystal semiconductor layer 102. The temperature of heat treatment is set within a range of equal to or higher than temperature at which hydrogen or halogen is released from the single crystal semiconductor layer 102 and equal to or lower than temperature close to a strain point of the support substrate 101.

Excessive halogen contained in the single crystal semiconductor layer 102 shows complicated behaviors and may operate so as to degrade characteristics of a semiconductor element depending on thermal history. For example, hydrogen contained between lattices of silicon has an operation of inactivating an impurity element added for the purpose of valence electron control. Accordingly, threshold voltage of the transistor is changed, and a resistance of source and drain regions is increased. Further, when hydrogen is contained in the lattices of silicon, the coordination number of silicon may be changed, and silicon may behave so as to generate lattice defects. As a matter of course, hydrogen or halogen has a function of compensating dangling bonds in silicon, in other words, a function of compensating defects, but it is preferable that hydrogen or halogen that has been implanted to form the separation layer 110 be removed from the single crystal semiconductor layer 102 once. For example, the heat treatment is performed at a temperature range of 400° C. to 730° C. As a heat treatment apparatus, an electrically-heated oven, a lamp annealing furnace, or the like can be applied. The heat treatment may be performed by changing temperature at multiple steps. Alternatively, a rapid thermal annealing (RTA) apparatus may be used. In the case of performing heat treatment by the RTA apparatus, the heat treatment can be conducted at a temperature close to the strain point of the substrate or a temperature slightly higher than the strain point.

Figure 5B:
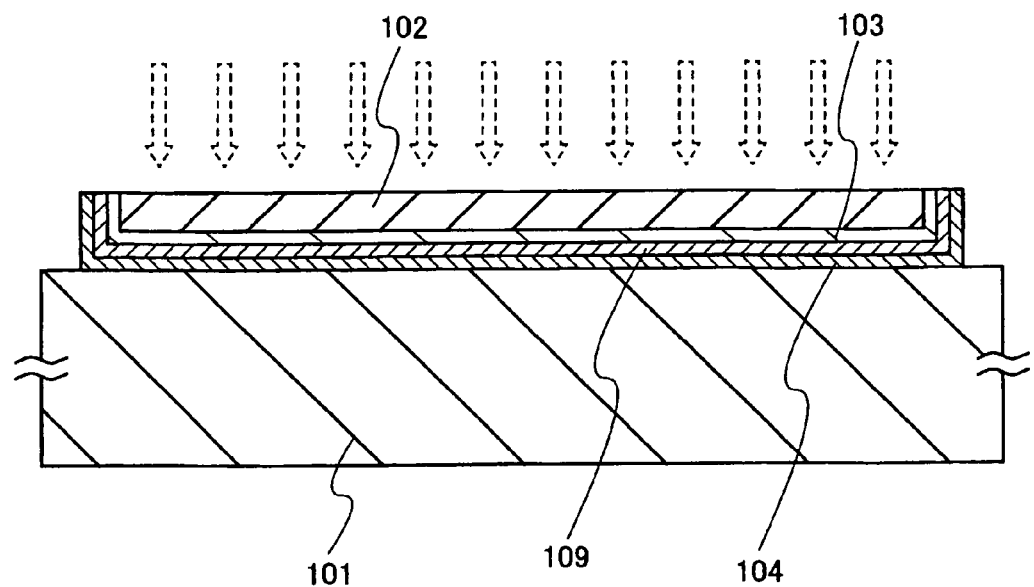

FIG. 5B illustrates a step in which crystal defects are repaired by irradiation of the single crystal semiconductor layer 102 with an energy beam. When the single crystal semiconductor layer 102 is bonded to the support substrate 101, the single crystal semiconductor layer 102 is thermally and/or mechanically damaged so that the crystallinity of the single crystal semiconductor layer 102 is decreased. Thus, irradiation of an energy beam is preferably conducted to repair the damages. The energy beam is preferably a beam that is selectively absorbed by the single crystal semiconductor layer 102. A laser beam is preferable. This is because the laser beam can recover the defects of the single crystal semiconductor layer 102, without heating excessively the support substrate 101. As the laser beam, a gas laser typified by an excimer laser or a solid state laser typified by a YAG laser can be used as a light source. A wavelength of the laser beam is preferably in a range of from ultraviolet light to a visible light region, and a wavelength of 190 to 700 nm is applied. The laser beam emitted from the light source is preferably converged in a rectangular or linear shape by an optical system, and irradiation may be performed by scanning the laser beam on the single crystal semiconductor layer 102.

Besides, flash lamp annealing which is performed using a halogen lamp, a xenon lamp, or the like may be applied for a similar object.

In FIG. 5A, the single crystal semiconductor layer 102 is dehydrogenated or dehalogenated in this step; therefore, crystal defects can be repaired without causing a void in the single crystal semiconductor layer 102. In addition, in FIG. 5B, when treatment of irradiating the single crystal semiconductor layer 102 with an energy beam is performed in a nitrogen atmosphere, the surface of the single crystal semiconductor layer 102 can be planarized.

Halogen contained in the single crystal semiconductor layer 102 is redistributed by the above-described treatment. A concentration gradient of the halogen in the single crystal semiconductor layer 102 is eased, and the mode thereof is shown as the curved line B of FIG. 2. Although it is preferable that halogen in the single crystal semiconductor layer 102 be distributed uniformly, the halogen may be distributed such that concentration thereof becomes higher on the surface of the single crystal semiconductor layer 102 side as the curved line B. In accordance with such distribution, defects in boundary regions of the following regions: a source region; a drain region; impurity semiconductor regions adjacent to the source and drain regions; and a channel formation region, can be repaired by halogen in a structure of a filed effect transistor.

Even through such a step of heat treatment, the above-described bonding layer 104 is placed between the single crystal semiconductor layer 102 and the support substrate 101, whereby stress distortion is eased, and bonding can be kept with strength force. In addition, stress distortion of the single crystal semiconductor layer 102 is eased, and crystallinity can be favorably kept.

Next, another method for manufacturing a substrate having an SOI structure is described with reference to FIGS. 7A to 9B.

Figure 7A:
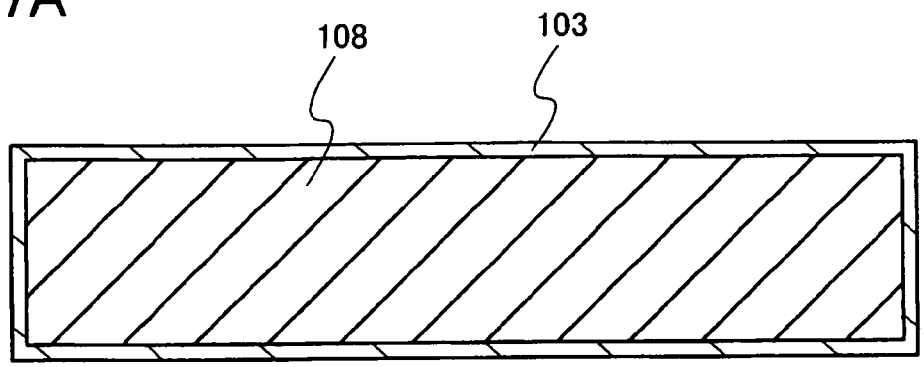
FIGS. 7A and 7B are cross-sectional views illustrating a method for manufacturing a substrate having an SOI structure.
Figure 7B:
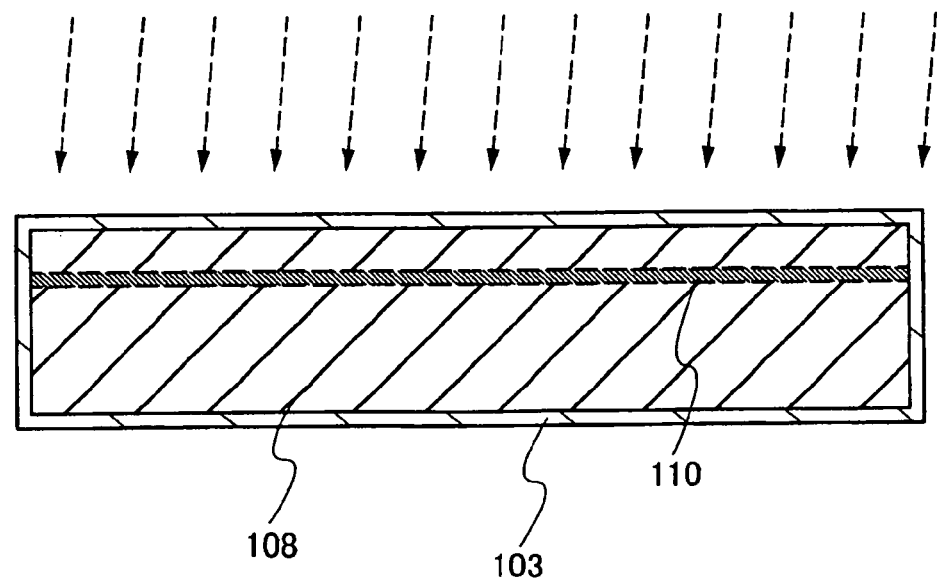

In FIG. 7A, the oxide film 103 is formed on the semiconductor substrate 108 by thermal oxidation. The oxide film 103 is preferably formed by thermal oxidation at a temperature of 700° C. or higher, preferably from 950° C. to 1100° C. in an atmosphere containing HCl as a halogen gas of 0.5 to 10 volume % (preferably 3 volume %) to oxygen. Then, the separation layer 110 is formed as illustrated in FIG. 7B. The separation layer 110 is formed by ion irradiation in which the semiconductor substrate 108 is irradiated with ions accelerated in electric field, similarly to the case of FIG. 3A.

Figure 8A:
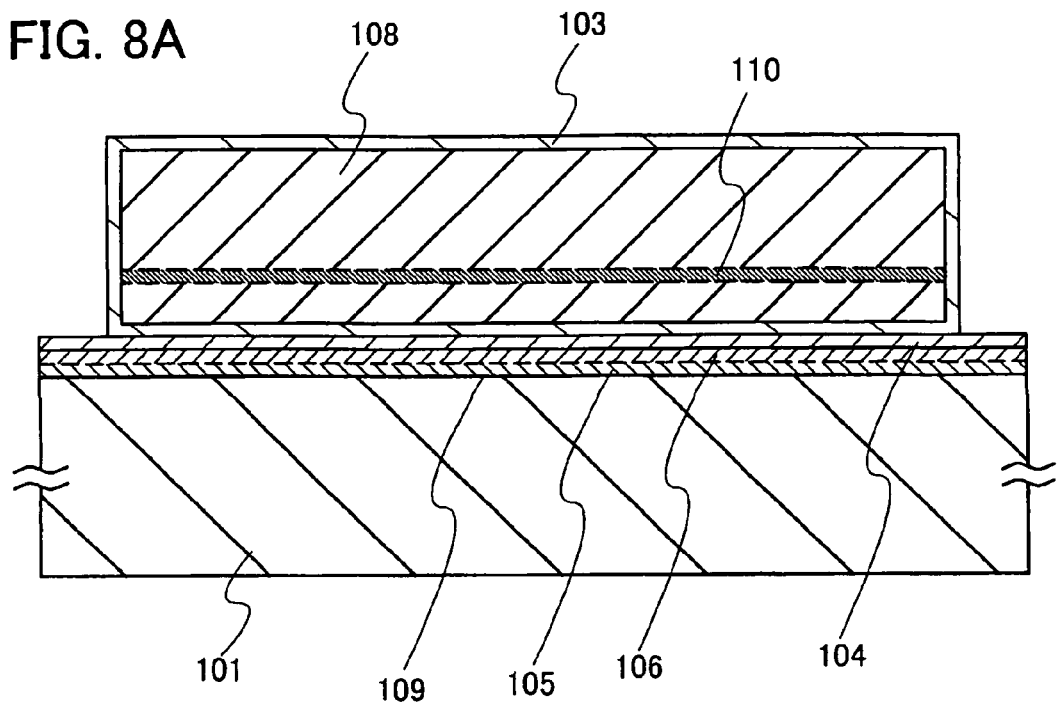
FIGS. 8A and 8B are cross-sectional views illustrating a method for manufacturing a substrate having an SOI structure.

In FIG. 8A, the blocking layer 109 is provided for the support substrate 101. The blocking layer 109, for example, can include the silicon nitride oxide film 105 and the silicon oxynitride film 106. The silicon nitride oxide film 105 has a function of preventing an impurity such as metal contained in the support substrate 101 from diffusing into the single crystal semiconductor layer 102 side. In the manufacturing method illustrated in FIGS. 7A to 9B, before the oxide film 103 and the bonding layer 104 formed over the support substrate 101 are bonded, the silicon nitride oxide film 105 is provided on the surface side of the support substrate 101, where the bond is formed. Thus, the single crystal semiconductor layer 102 can be prevented from being contaminated by an impurity diffused from the support substrate 101, and further, contamination of the bonding layer 104 can also be prevented, thereby preventing decrease of the bonding strength due to the impurity. The silicon oxynitride film 106 has a function of reducing internal stress of the silicon nitride oxide film 105. By providing the blocking layer 109 having such a stacked structure, contamination due to impurities of the single crystal semiconductor layer 102 can be prevented and further stress distortion can be eased.

The bonding layer 104 is provided over the blocking layer 109. This bonding layer 104 is a layer having a planar surface with a hydrophilic property. An insulating layer which is formed by thermal reaction or chemical reaction is preferable as a layer having such a surface. The bonding layer 104 which has a planar surface with a hydrophilic property is provided with a thickness of 0.2 to 500 nm. With such a thickness, it is possible to smooth surface roughness of a surface on which a film is to be formed and also to ensure smoothness of a growing surface of the film. As the bonding layer 104, a silicon oxide film is preferably formed. The thickness of the silicon oxide film is 10 to 200 nm, preferably 10 to 100 nm, and more preferably 20 to 50 nm. It is preferable to form a silicon oxide film by a chemical vapor deposition method with the use of an organic silane gas.

The support substrate 101, over which the blocking layer 109 and the bonding layer 104 are formed, and the semiconductor substrate 108, on which the oxide film 103 is formed, are bonded in close contact with each other. In this case, the bond is formed by bonding the oxide film 103 and the bonding layer 104. By pressing the support substrate 101 and the semiconductor substrate 108, the bonding strength can be increased by hydrogen bond.

Figure 8B:
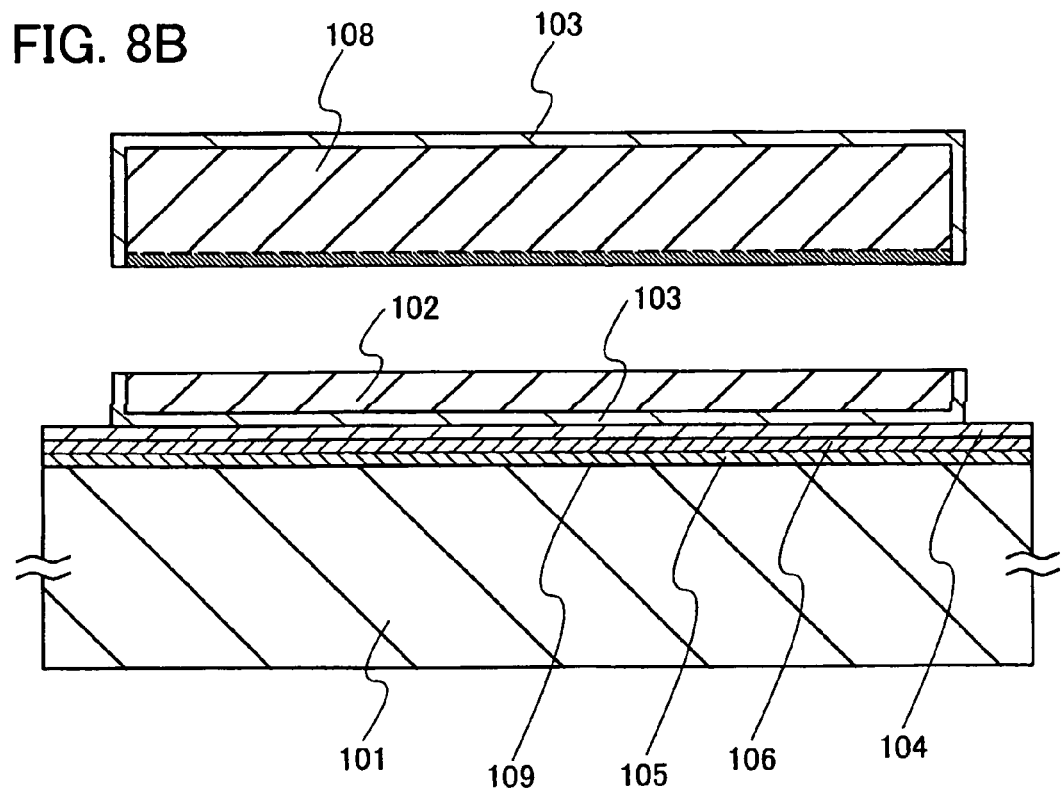

FIG. 8B illustrates a step in which the single crystal semiconductor layer 102 is formed by separation of a part of the semiconductor substrate 108 by heat treatment. The heat treatment is performed with the semiconductor substrate 108 and the support substrate 101 superposed. The semiconductor substrate 108 is separated from the support substrate 101 by heat treatment with the single crystal semiconductor layer 102 left on the support substrate 101. Heat treatment is preferably performed at a temperature of higher than or equal to a film formation temperature of the bonding layer 104 and equal to or lower than the heat resistant temperature of the support substrate 101. For example, heat treatment is performed at a temperature of 400° C. or higher and lower than 600° C., so that the volume of the microvoids which are formed in the separation layer 110 is changed by the heat treatment and the semiconductor substrate 108 can be separated along the separation layer 110. Since the bonding layer 104 is bonded to the support substrate 101, the single crystal semiconductor layer 102 having the same crystallinity as the semiconductor substrate 108 is bonded and left on the support substrate 101.

Figure 9A:
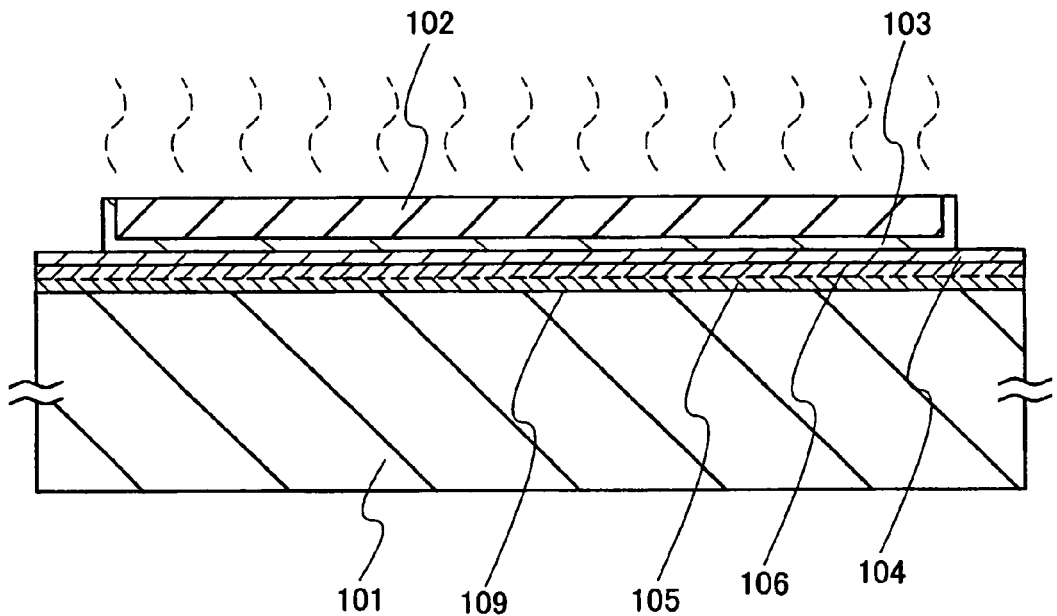
FIGS. 9A and 9B are cross-sectional views illustrating a method for manufacturing a structure having an SOI structure.
Figure 9B:
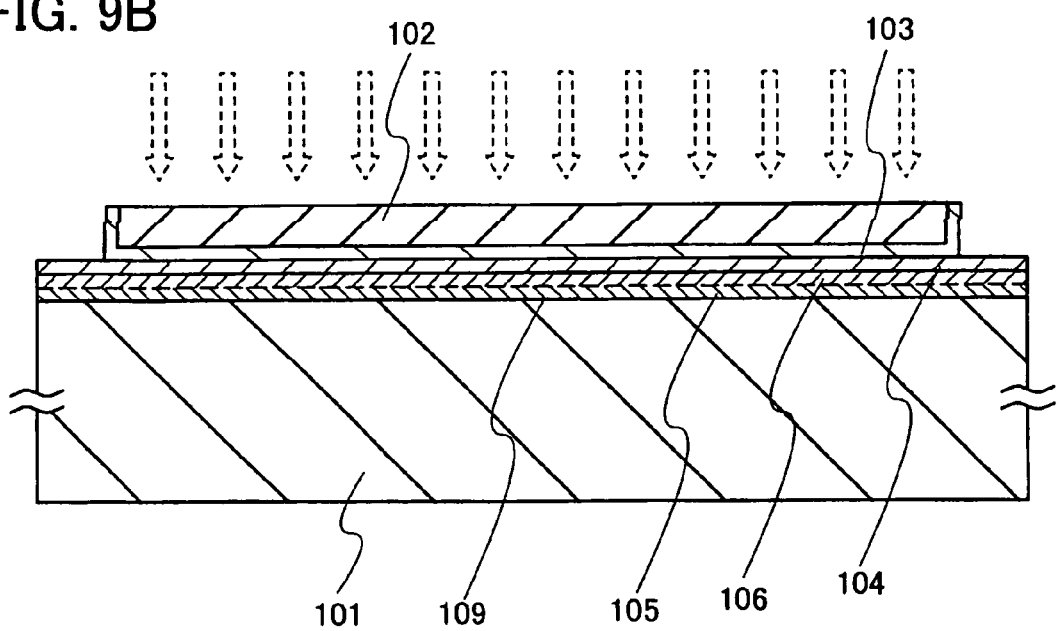

FIG. 9A illustrates a step in which heat treatment is performed with the single crystal semiconductor layer 102 fixed on the support substrate 101, and the step is similar to that of FIG. 5A. By such heat treatment, hydrogen bond at the bonding interface between the support substrate 101 and the single crystal semiconductor layer 102 can be changed into covalent bond that is stronger than a hydrogen bond. In addition, FIG. 9B illustrates a step in which the single crystal semiconductor layer 102 is irradiated with an energy beam to recover crystal defects, and the step is similar to that of FIG. 5B.

In this mode, an oxide film containing halogen that is formed by oxidizing a semiconductor substrate directly in an atmosphere containing halogen and a blocking layer formed using an insulating film containing nitrogen are provided in contact with each other between the single crystal semiconductor layer and the support substrate. By providing the oxide film containing halogen by oxidizing the semiconductor substrate in an atmosphere containing halogen, the defect level density in an interface between the single crystal semiconductor layer and the oxide film is decreased and adhesion between the single crystal semiconductor layer and the blocking layer can be improved. Further, by providing the blocking layer formed using an insulating film containing nitrogen, the single crystal semiconductor layer can be prevented from being contaminated due to an impurity. Furthermore, when the bonding layer provided between the blocking layer and the support substrate is formed using a silicon oxide film containing hydrogen (and/or an OH group), the bonding layer has a function as a buffer body that reduces stress. Therefore, thermal stress that is applied to the single crystal semiconductor layer unintentionally can be reduced. In a case where external force is applied to the single crystal semiconductor layer, by dispersing the external force, resistance to separation due to the external force can be enhanced.

According to this embodiment mode, even when a substrate having upper temperature limit of 700° C. or lower, such as a glass substrate is used as the support substrate 101, the single crystal semiconductor layer 102 can have strong adhesion in the bonding portion. As the support substrate 101, a variety type of glass substrates used in the electronics industry, which employs non-alkali glass, such as aluminosilicate glass substrates, aluminoborosilicate glass substrates, and barium borosilicate glass substrates can be applied. In other words, a single crystal semiconductor layer can be formed over a substrate that is longer than one meter on one side.

With the use of such a large-area substrate, not only a display device such as a liquid crystal display but also a semiconductor integrated circuit can be manufactured. In addition, as to the semiconductor substrate, thermal oxidation is performed in an atmosphere containing halogen in the first step of the manufacturing process, so that a gettering effect can be obtained, which is effective in reutilizing the semiconductor substrate.

Embodiment Mode 2

This embodiment mode exemplifies reuse of a semiconductor substrate after a single crystal semiconductor layer is separated. Since the thickness of the single crystal semiconductor layer is 1 μm or less as described in Embodiment Mode 1, if a semiconductor substrate with a thickness of 400 μm is used for example, the same semiconductor substrate is used repeatedly, so that a substrate having an SOI structure can be manufactured.

Figure 10A:
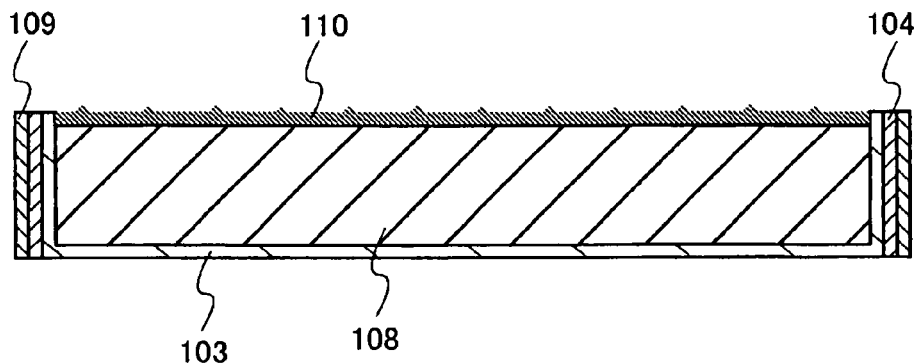
FIGS. 10A to 10D are diagrams illustrating a method for reusing a semiconductor substrate that is used in manufacture of a substrate having an SOI structure.
Figure 10B:
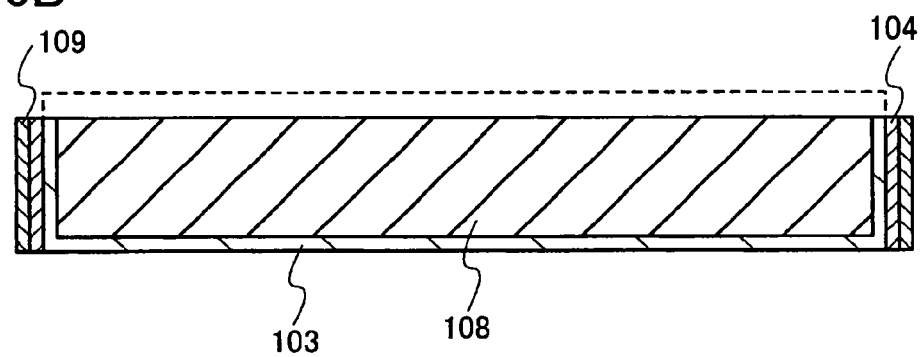
Figure 10C:
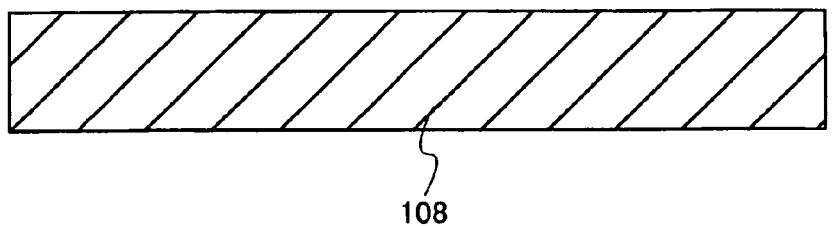
Figure 10D:
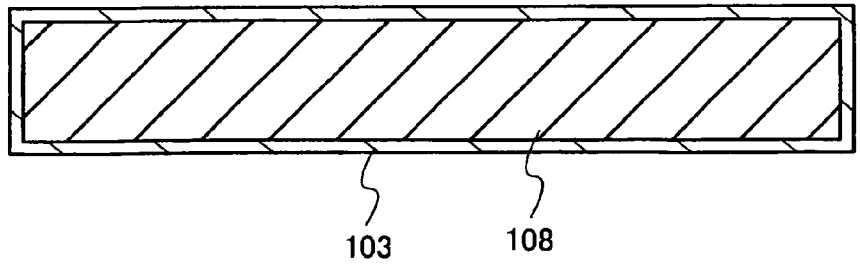

A method for reusing a semiconductor substrate that has been used in manufacture of a substrate having an SOI structure is described with reference to FIGS. 10A to 10D. FIG. 10A illustrates the semiconductor substrate 108 after a separation step of the single crystal semiconductor layer. The semiconductor substrate is provided with part of the oxide film 103, part of the bonding layer 104, part of the blocking layer 109, and part of the separation layer 110, each of which are left after separation. A surface of the separation layer 110 has depressions and projections of surface-roughness of about 100 nm caused by separation along the separation layer 110. In FIG. 10B, such a separation layer 110 having a depression and projection surface is removed together with the other layers left on the surface side of the semiconductor substrate 108 by CMP, so that the surface of the semiconductor substrate 108 is planarized. After the planarization treatment, the semiconductor substrate 108 may be irradiated with a laser beam in order to repair the semiconductor substrate 108 damaged by CMP. FIG. 10C illustrates a step of cleaning the semiconductor substrate 108. The oxide film 103, the bonding layer 104, and the blocking layer 109, and the like, which remains in the semiconductor substrate 108, are removed, and the semiconductor substrate 108 is washed using a sulfuric acid/hydrogen peroxide mixture (SPM), an ammonium hydroxide/hydrogen peroxide mixture (APM), a hydrochloric acid/hydrogen peroxide mixture (HPM), dilute hydrogen fluoride (DHF), or the like as appropriate. Steps thereafter may be performed similarly to Embodiment Mode 1, and FIG. 10D illustrates a step of forming an oxide film 103 newly by performing thermal oxide to the semiconductor substrate 108.

Figure 11A:
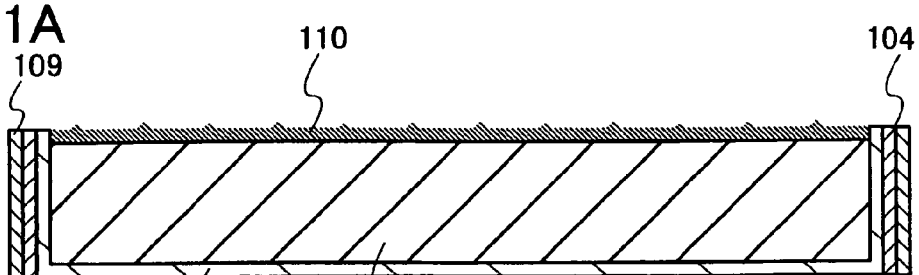
FIGS. 11A to 11E are diagrams illustrating a method for reusing a semiconductor substrate that is used in manufacture of a substrate having an SOI structure.
Figure 11B:
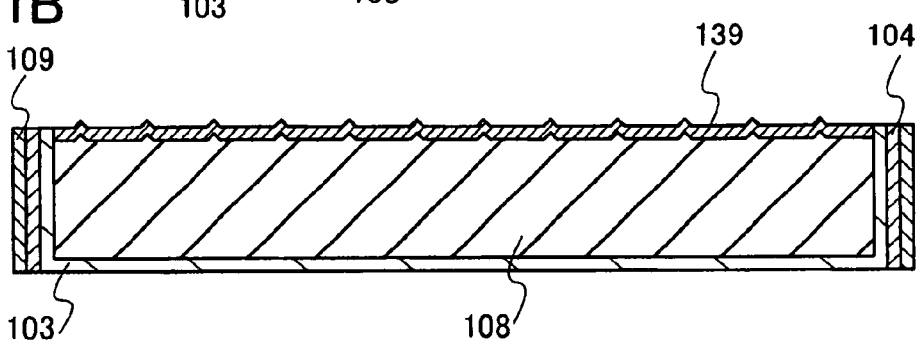

Instead of polishing the surface of the semiconductor substrate 108 by CMP, the semiconductor substrate 108 may be irradiated with a laser beam to perform recovery of crystallinity and planarization of the surface. Another method for reusing a semiconductor substrate that has been used for manufacture of a substrate having an SOI structure is described with reference FIGS. 11A to 11E. As shown in FIG. 11A, thermal oxidation is performed to the semiconductor substrate 108 with a remaining separation layer 110. Thermal oxidation may be performed by dry oxidation, steam oxidation, hydrochloric acid oxidation, or the like. FIG. 11B shows a state in which an oxide film 139 is formed on the semiconductor substrate 108. Thermal oxidation is preformed at 950° C. to 1150° C., and halogen remaining in the semiconductor substrate 108 gets out by this treatment.

Figure 11C:
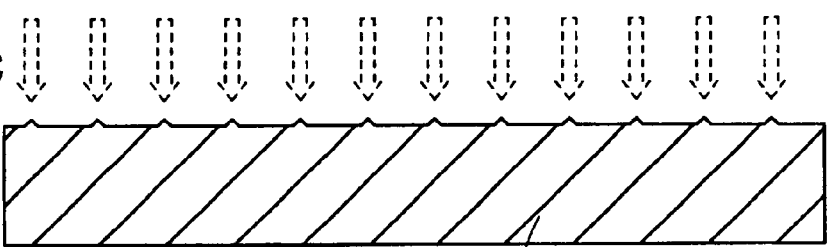
Figure 11D:
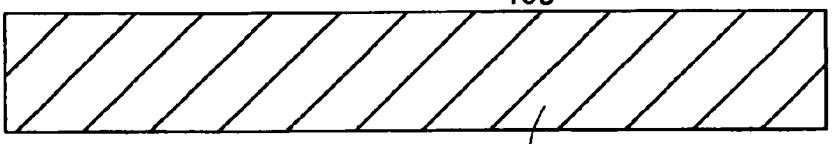
Figure 11E:
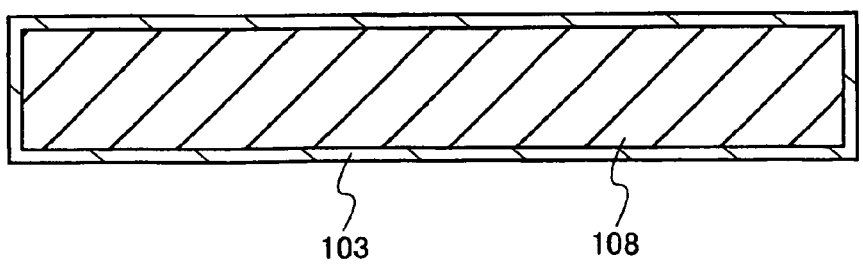

After that, as shown in FIG. 11C, the semiconductor substrate 108 is irradiated with a laser beam to perform recovery of crystallinity and planarization treatment. As a laser beam, a gas laser typified by an excimer laser and a solid laser typified by a YAG laser can be used as a light source. A wavelength of the laser beam is preferably in a range of from UV light to a visible light region, and a wavelength of from 190 to 700 nm is applied. The laser beam emitted from the light source is preferably condensed in a rectangular shape or a linear shape, and the semiconductor substrate 108 may be irradiated with the laser beam by scanning the laser beam. Irradiation with the laser beam in an atmosphere containing oxygen is effective in recovery of crystallinity of the semiconductor substrate 108. Further, irradiation with the laser beam in a nitrogen atmosphere is effective for planarization of the surface of the semiconductor substrate 108. In this case, it is desirable that a thin oxide film (such as a natural oxide film) formed on the surface of the semiconductor substrate 108 is removed in advance. By such treatment, the semiconductor substrate 108 having a smooth surface as shown in FIG. 11D is obtained. The semiconductor substrate 108 is washed using a sulfuric acid/hydrogen peroxide mixture (SPM), an ammonium hydroxide/hydrogen peroxide mixture (APM), a hydrochloric acid/hydrogen peroxide mixture (HPM), dilute hydrogen fluoride (DHF), or the like as appropriate. Steps thereafter may be performed similarly to Embodiment Mode 1, and FIG. 11D illustrates a step of forming an oxide film 103 by performing thermal oxidation to the semiconductor substrate 108.

Figure 12:
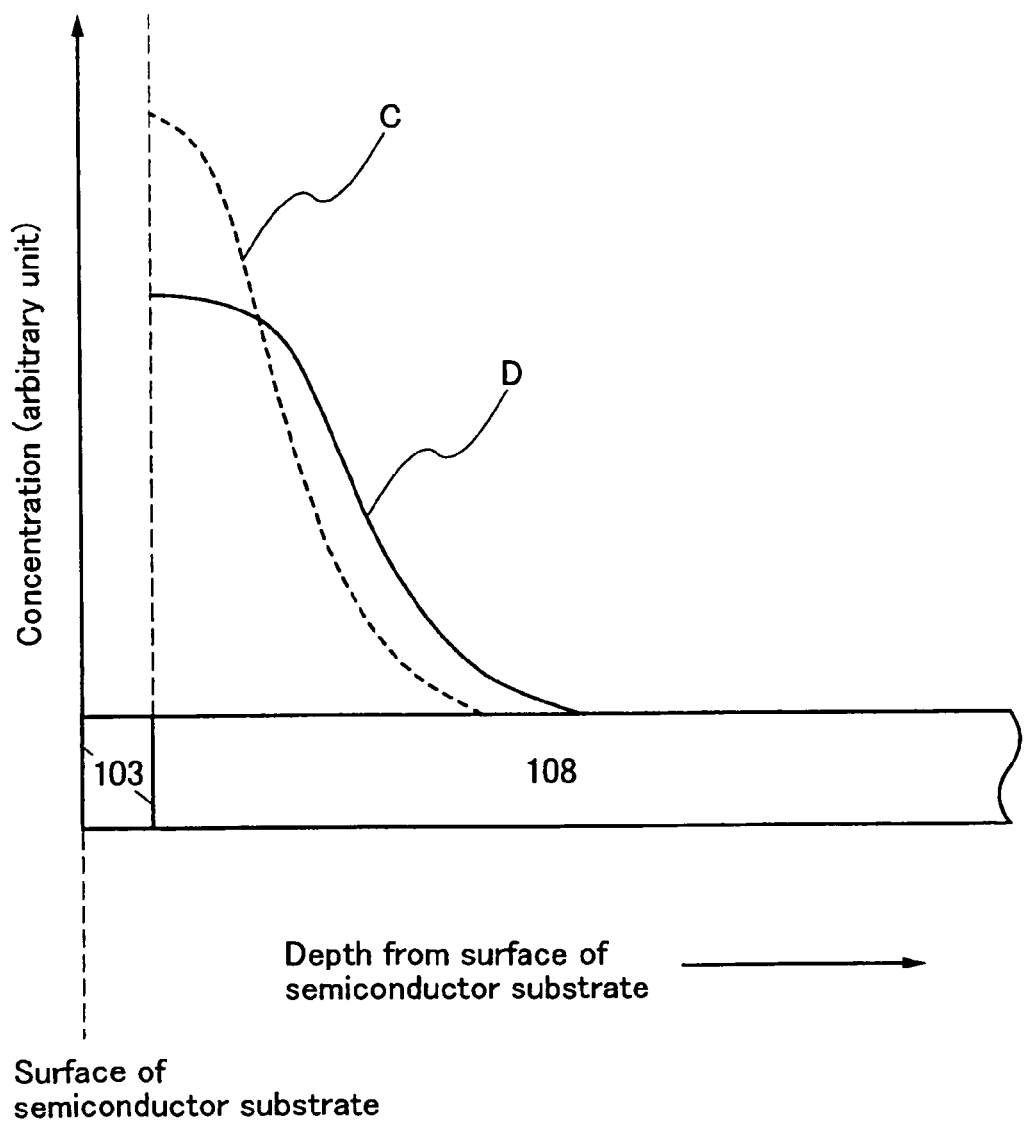
FIG. 12 is a graph schematically describing distribution of halogen in a semiconductor substrate.

As distribution of halogen in the semiconductor substrate 108, concentration of halogen on the surface side is increased because a region where the separation layer 110 has been provided is to be the surface. According to this mode, halogen is to be redistributed by heat treatment or thermal oxidation performed in a later step. FIG. 12 shows distribution of halogen in the semiconductor substrate 108 schematically, which shows distribution of halogen in the first step (after the separation step has been finished) of this mode (a curved line C) and distribution after the oxide film is formed by thermal oxidation (a curved line D). It is considered that halogen contained in the semiconductor substrate 108 partially vaporizes and gets out into the air by thermal oxidation, and halogen remaining in the semiconductor substrate 108 is redistributed by diffusion.

Figure 13:
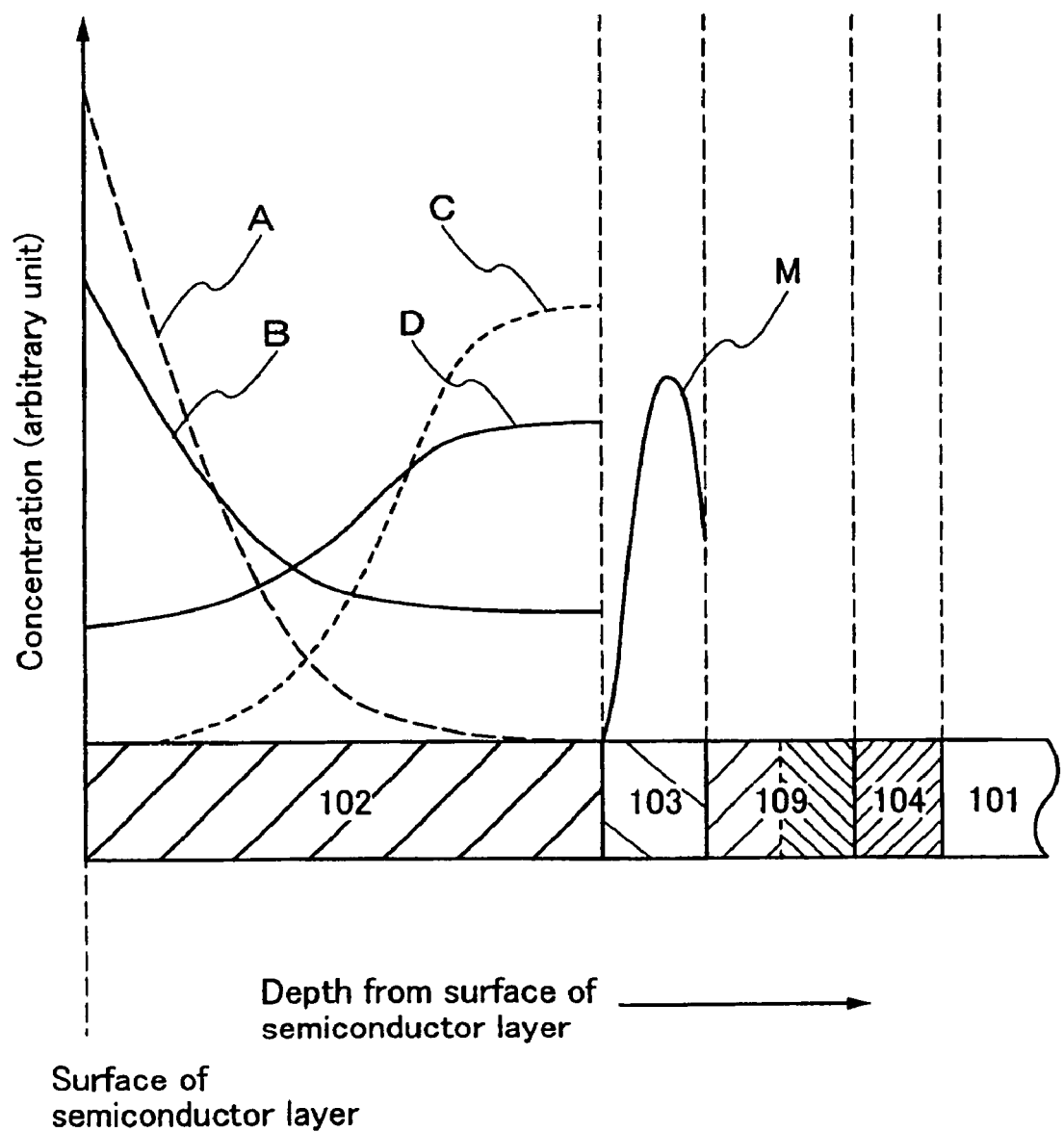
FIG. 13 is a graph schematically describing distribution of halogen in a single crystal semiconductor layer.

FIG. 13 shows distribution of halogen in the single crystal semiconductor layer 102 in the case of reusing the semiconductor substrate 108 processed in this mode. As compared with FIG. 2, distribution of halogen in the first step of this mode shown in FIG. 13 is that concentration of halogen becomes higher toward the interface side between the single crystal semiconductor layer 102 and the oxide film 103 (a curved line C). Then, by performing the similar step to that of Embodiment Mode 1, such as thermal oxidation, halogen is redistributed as shown by a curved line D. In accordance with such distribution of halogen, a large amount of halogen is contained at the interface of the single crystal semiconductor layer 102 on the support substrate side, and there is an effect of reducing interface defect level density. Further, similarly to FIG. 2, a metal impurity is captured in the oxide film 103 (a curved line M). When the single crystal semiconductor layer 102 is separated from the semiconductor substrate 108 by performing heat treatment in the later step, halogen is distributed such that concentration thereof becomes higher toward the surface of the single crystal semiconductor layer 102 (the surface opposite to the support substrate 101 side) (a curved line A), and halogen contained in the single crystal semiconductor layer 102 is redistributed by performing heat treatment or irradiation with a laser beam, so that a concentration gradient is moderated (a curved line B).

According to this embodiment mode, a semiconductor substrate that is a base of a single crystal semiconductor layer can be reused in manufacture of a substrate having an SOI substrate. Accordingly, consumption of the semiconductor substrate can be reduced, and manufacturing cost can be reduced.

Embodiment Mode 3

Figure 14A:
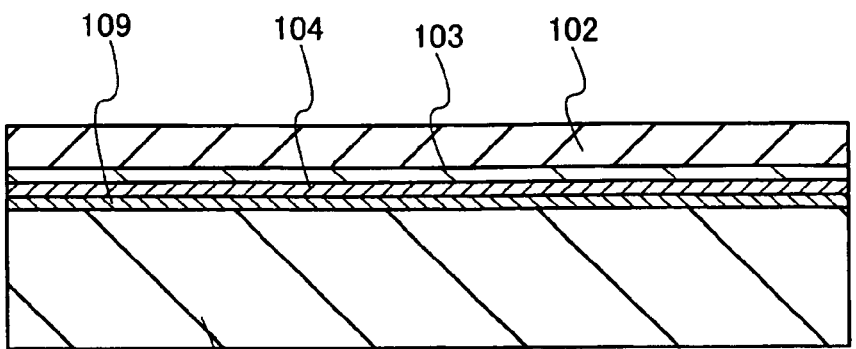
FIGS. 14A to 14D are cross-sectional views illustrating a method for manufacturing a semiconductor device using a substrate having an SOI substrate.

In this embodiment mode, a method for manufacturing a semiconductor device using the substrate having an SOI structure that is manufactured in Embodiment Mode 1 or 2 is described with reference FIGS. 14A to 15B. In FIG. 14A, the oxide film 103 is formed on the single crystal semiconductor layer 102 as a first insulating layer, and the blocking layer 109 as a second insulating layer and the bonding layer 104 as a third insulating layer are also formed. The single crystal semiconductor layer 102 provided with the described layers is bonded to the support substrate 101. The blocking layer 109 may be provided for the support substrate 101 side. By providing the blocking layer 109, the single crystal semiconductor layer 102 can be prevented from being contaminated by an impurity. The blocking layer 109 includes a silicon nitride layer and a silicon nitride oxide layer. Alternatively, for the blocking layer 109, an aluminum nitride layer and an aluminum nitride oxide layer may be applied.

The thickness of the single crystal semiconductor layer 102 is set to be 5 to 500 nm, preferably, 10 to 200 nm, more preferably, 10 to 60 nm. The thickness of the single crystal semiconductor layer 102 can be appropriately set by control of the depth of the separation layer 110 as illustrated in FIG. 3B. To the single crystal semiconductor layer 102, an impurity imparting p-type conductivity such as boron, aluminum, or gallium or an impurity imparting n-type conductivity such as phosphorus or arsenic is preferably added to correspond to a formation region of an n-channel field-effect transistor or a p-channel field-effect transistor. In other words, an impurity imparting p-type conductivity is added to a formation region of an n-channel field-effect transistor or an impurity imparting n-type conductivity is added to a formation region of a p-channel field-effect transistor, whereby a so-called well region is formed. The dose of ions of an impurity imparting n-type conductivity or an impurity imparting p-type conductivity may be approximately $1 \times 10^{12}$ ions/cm$^2$ to $1 \times 10^{14}$ ions/cm$^2$. Furthermore, in the case of controlling the threshold voltage of the field effect transistors, an impurity imparting n-type conductivity or an impurity imparting p-type conductivity impurity may be added to the well region.

Figure 14B:
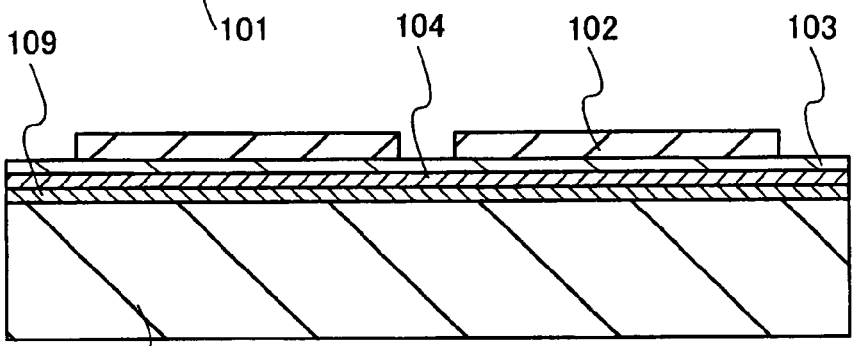
Figure 14C:
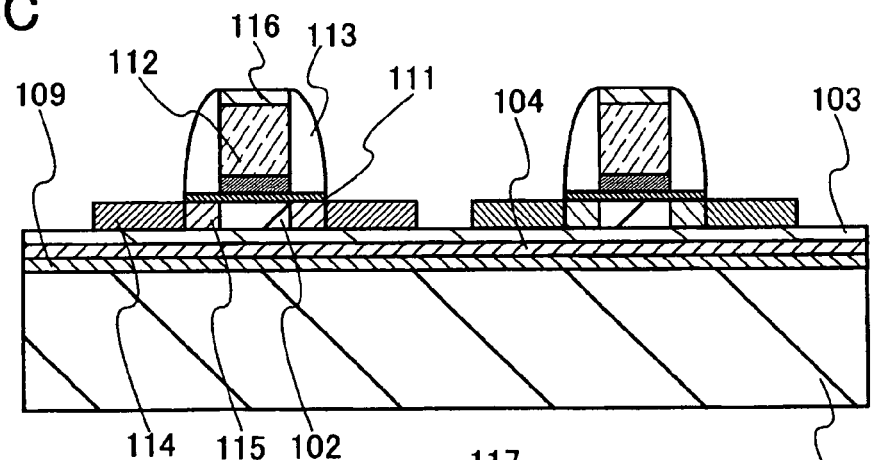

As shown in FIG. 14B, the single crystal semiconductor layer 102 is etched to form single crystal semiconductor layers 102 which are isolated in island-like shape from each other to correspond to the arrangement of semiconductor elements. Then, as shown in FIG. 14C, a gate insulating layer 111, a gate electrode 112, and a sidewall insulating layer 113 are formed and a first impurity region 114 and a second impurity region 115 are formed. The insulating layer 116 is formed of silicon nitride and is used as a hard mask in etching the gate electrode 112.

Figure 14D:
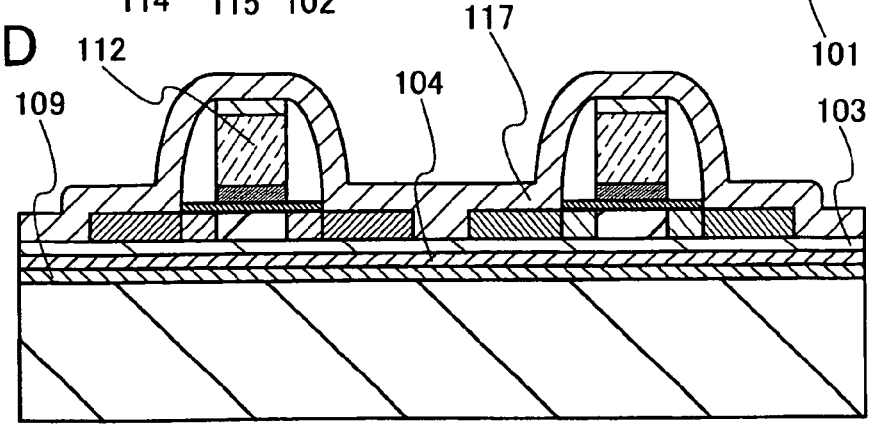

FIG. 14D illustrates a step in which a protective film 117 is formed after forming the gate electrode 112 and the like. As the protective film 117, a silicon nitride film or a silicon nitride oxide film is preferably formed by a plasma CVD method at a substrate temperature of 350° C. or lower during film formation. In other words, the protective film 117 is made to contain hydrogen. After the protective film 117 is formed, hydrogen contained in the protective film 117 is diffused into the single crystal semiconductor layer 102 side by heat treatment at 350° C. to 450° C. (preferably, 400° C. to 420° C.). By supply of hydrogen, which compensates defects during an element formation step, to the single crystal semiconductor layer 102, which has been dehydrogenated in the previous step, such defects as to serve as capture centers can be compensated effectively. In addition, the blocking layer 109 prevents impurity diffusion from the support substrate 101 side, whereas the protective film 117 is effective in preventing impurity contamination from the upper layer side. In this embodiment mode, an upper layer side and a lower layer side of the single crystal semiconductor layer 102 having excellent crystallinity are covered with insulating layers which are highly effective in preventing highly mobile impurity ions of sodium or the like. Therefore, a great effect in stabilizing the characteristics of a semiconductor element manufactured using the single crystal semiconductor layer 102 is obtained.

Figure 15A:
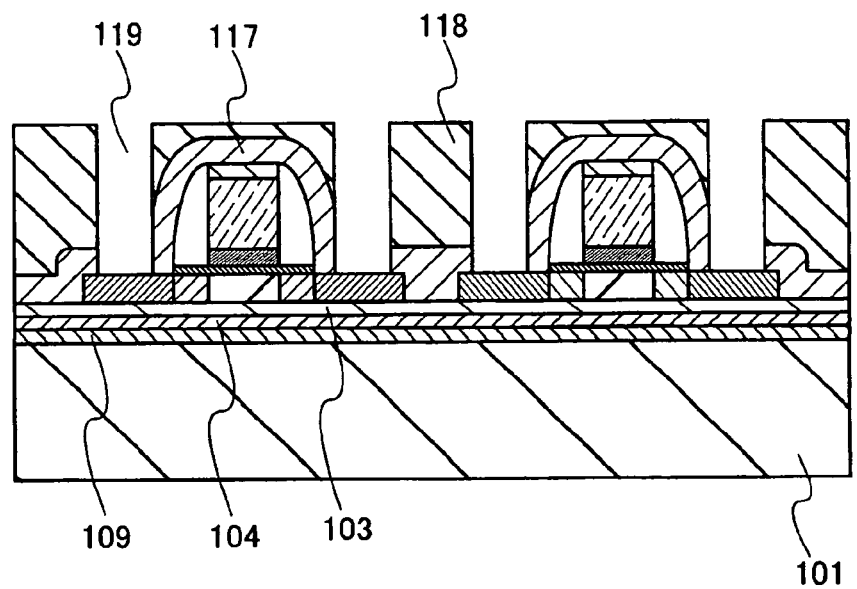
FIGS. 15A and 15B are cross-sectional views illustrating a method for manufacturing a semiconductor device using a substrate having an SOI substrate.

After that, an interlayer insulating film 118 is formed as shown in FIG. 15A. As the interlayer insulating film 118, a BPSG (boron phosphorus silicon glass) film is formed or an organic resin typified by polyimide is formed by coating. In the interlayer insulating film 118, a contact hole 119 is formed.

Figure 15B:
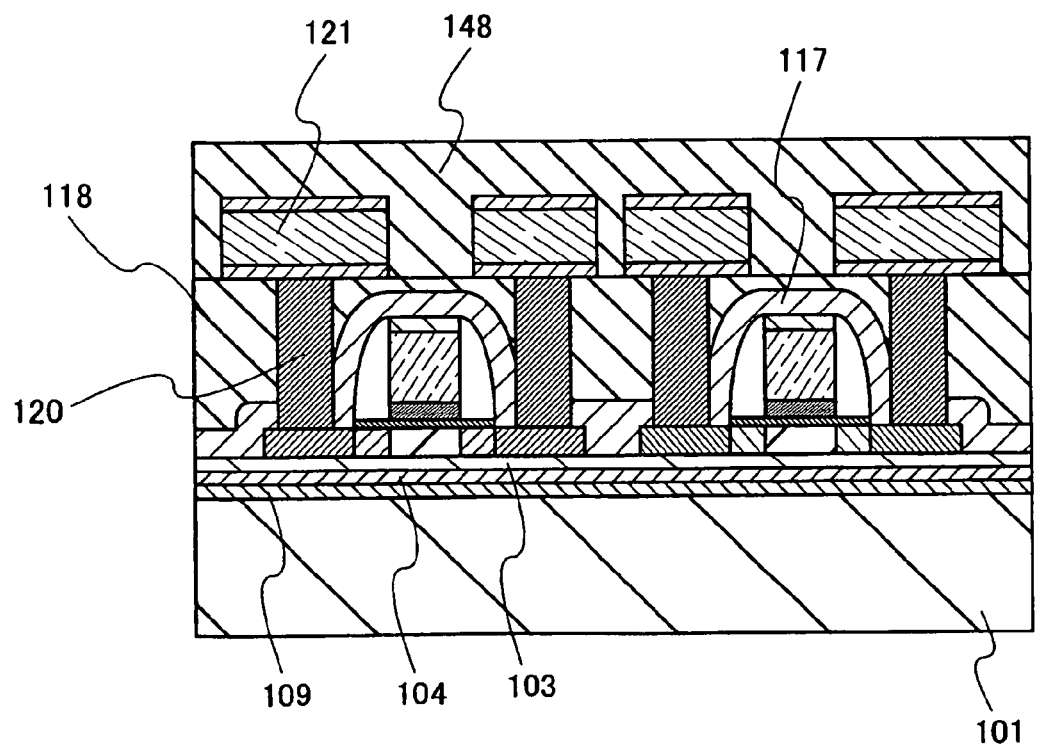

FIG. 15B illustrates a step in which a wiring is formed. In the contact hole 119, a contact plug 120 is formed. As the contact plug 120, tungsten silicide is formed by a chemical vapor deposition method from a $WF_6$ gas and a $SiH_4$ gas to fill the contact hole 119. Alternatively, tungsten may be formed by hydrogen reduction of a $WF_6$ gas to fill the contact hole 119. After that, a wiring 121 is formed to correspond to the contact plug 120. The wiring 121 is formed of aluminum or an aluminum alloy, and an upper layer and a lower layer thereof are formed using metal layers of molybdenum, chromium, titanium, or the like as barrier metal. Furthermore, an interlayer insulating layer 148 is formed thereover. The wiring may be provided as appropriate, and a multilayer wiring may be formed by further forming a wiring layer thereover. In that case, a damascene process may be employed.

In this manner, field effect transistors can be manufactured using the single crystal semiconductor layer 102 that is bonded to the support substrate 101. The single crystal semiconductor layer 102 according to this embodiment mode is formed of a single crystal semiconductor that has uniform crystal orientation; therefore, uniform, high-performance field effect transistors can be obtained. In other words, it is possible to suppress inhomogeneity of values of important transistor characteristics, such as threshold voltage and mobility, and to achieve higher performance such as higher mobility.

In addition, the oxide film 103 that contains halogen is provided on the back channel side (the side opposite to a gate electrode 112) of the single crystal semiconductor layer 102, and local level density is decreased; therefore, variation of threshold voltage between transistors can be suppressed. Furthermore, the blocking layer 109 as well as the oxide film 103 that contains halogen is provided between the support substrate 101 and the single crystal semiconductor layer 102; therefore, the single crystal semiconductor layer 102 can be prevented from being contaminated by diffusion of a metal impurity such as sodium from the support substrate 101 side.

According to this embodiment mode, halogen contained in the single crystal semiconductor layer is distributed such that concentration thereof becomes higher toward the surface (the surface opposite to the support substrate side) of the single crystal semiconductor layer. That is, concentration of halogen is increased in boundary regions, which are close to a gate electrode side, of the following regions formed in the single crystal semiconductor layer: a source region; a drain region; impurity semiconductor regions adjacent to the source and drain regions; and a channel formation region in the structure of the field effect transistor. As a result, junction leakage current can be decreased. Further, by such a structure, the interface level density in the channel formation region is reduced, and a semiconductor device with a steep rising characteristic and excellent hot-carrier resistance can be obtained.

Embodiment Mode 4

Figure 16:
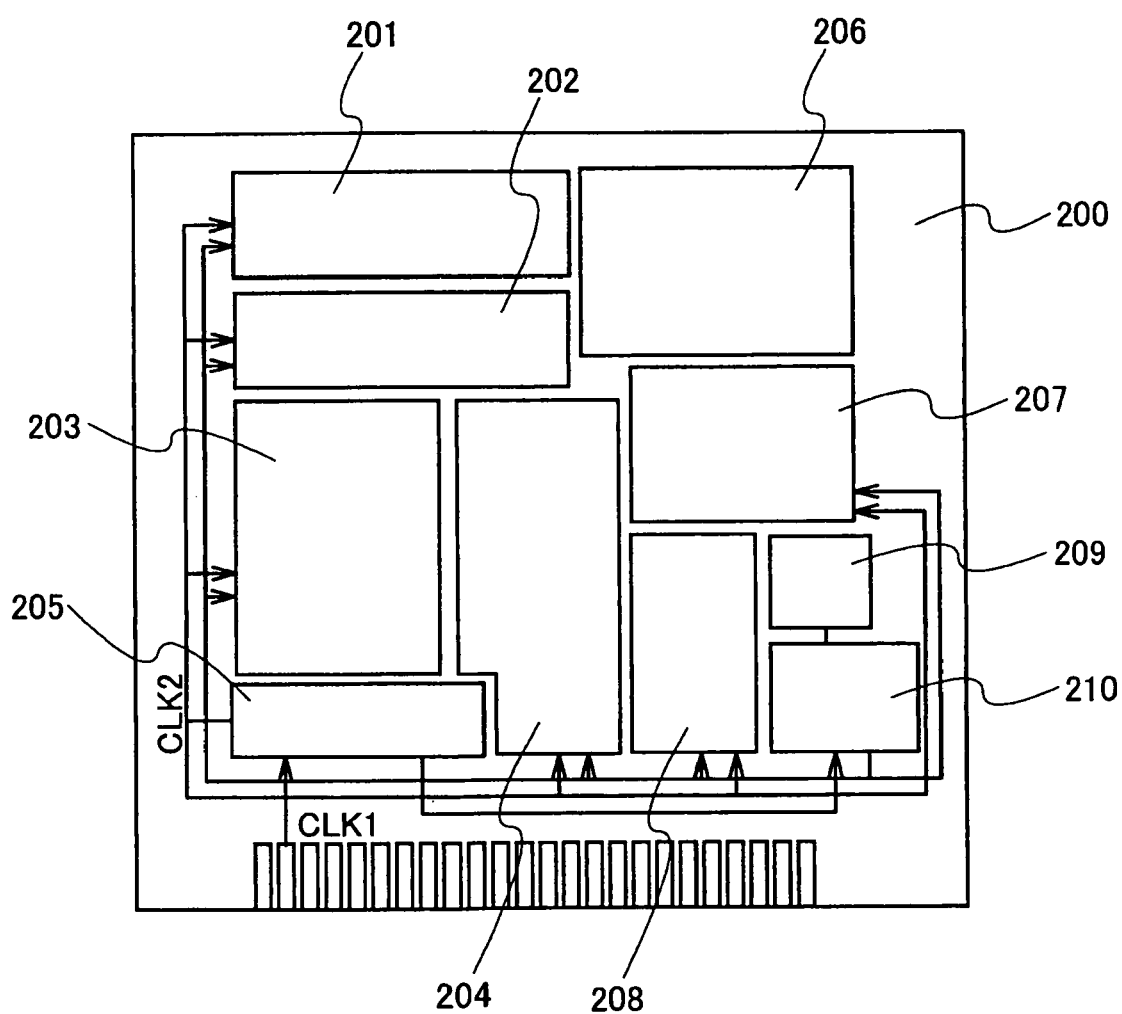
FIG. 16 is a block diagram showing a structure of a microprocessor obtained from a substrate having an SOI structure.

This embodiment mode shows one mode of a semiconductor device illustrated by Embodiment Mode 3. FIG. 16 illustrates a structure of a microprocessor obtained using a substrate having an SOI structure as an example of a semiconductor device. A microprocessor 200 is manufactured using the semiconductor substrate formed according to this embodiment mode as described above. This microprocessor 200 has an arithmetic logic unit (ALU) 201, an ALU controller 202, an instruction decoder 203, an interrupt controller 204, a timing controller 205, a register 206, a register controller 207, a bus interface (Bus I/F) 208, a read-only memory (ROM) 209, and a ROM interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction. Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the internal clock signal CLK2 to the various above-mentioned circuits. Obviously, the microprocessor 200 shown in FIG. 16 is merely an example in which the configuration is simplified, and an actual microprocessor may have a wide variety of configurations depending on the uses.

Such a microprocessor 200 has the same function with that of the semiconductor device shown in Embodiment Mode 3 and can achieve not only an increase in processing speed but also reduction in power consumption. Since the oxide film containing halogen is formed on a back channel side (on the opposite side to a gate electrode) of the single crystal semiconductor layer included in a field effect transistor constituting a part of the microprocessor 200, the local level density is decreased and thus variation of a threshold voltages between transistors can be suppressed. In addition, since halogen is contained in the single crystal semiconductor layer, the junction leakage current can be reduced even when the gate length is shortened. Further, in addition to the oxide film containing halogen, the blocking layer is also provided between the support substrate and the single crystal semiconductor layer, thereby preventing the single crystal semiconductor layer from being contaminated by diffusion of an impurity such as metal of sodium or the like from the support substrate side.

Figure 17:
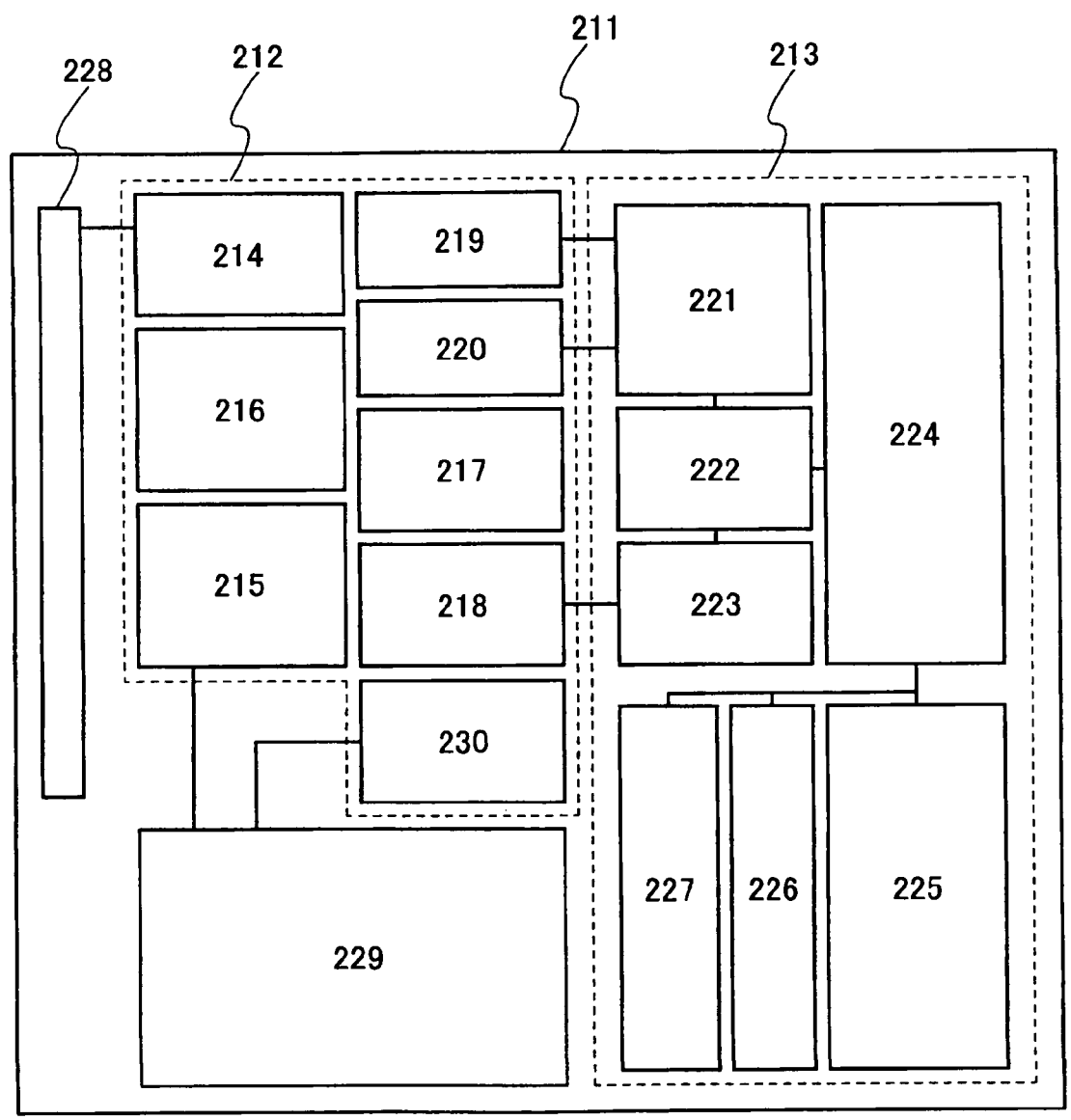
FIG. 17 is a block diagram showing a structure of an RFCPU that is obtained by a structure having an SOI structure.

Next, a structure of an RFCPU obtained using the substrate having an SOI structure is described with reference to FIG. 17 as an example of a semiconductor device having an arithmetic function that enables contactless data transmission and reception. FIG. 17 illustrates an example of a computer that operates to transmit and receive signals to and from an external device by wireless communication (such a computer is hereinafter referred to as an RFCPU). An RFCPU 211 has an analog circuit portion 212 and a digital circuit portion 213. The analog circuit portion 212 has a resonance circuit 214 with a resonance capacitor, a rectifier circuit 215, a constant voltage circuit 216, a reset circuit 217, an oscillator circuit 218, a demodulator circuit 219, a modulator circuit 220, and a power management circuit 230. The digital circuit portion 213 has an RF interface 221, a control register 222, a clock controller 223, a CPU interface 224, a central processing unit (CPU) 225, a random-access memory (RAM) 226, and a read-only memory (ROM) 227.

The operation of the RFCPU 211 having such a configuration is roughly as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and the capacitor portion 229 may be mounted as a different component on a substrate having an insulating surface which is included in the RFCPU 211.

The reset circuit 217 generates a signal for resetting and initializing the digital circuit portion 213. For example, the reset circuit 217 generates a signal which rises after rise in the power supply voltage with delay as a reset signal. The oscillator circuit 218 changes the frequency and duty ratio of a clock signal in response to a control signal generated by the constant voltage circuit 216. The demodulator circuit 219 formed using a low-pass filter binarizes the amplitude of, for example, a received amplitude-modulated (ASK) signal. The modulator circuit 220 varies the amplitude of an amplitude-modulated (ASK) transmission signal and transmits the signal. The modulator circuit 220 changes the amplitude of a communication signal by changing a resonance point of the resonance circuit 214. The clock controller 223 generates a control signal for changing the frequency and duty ratio of a clock signal in accordance with the power supply voltage or a consumption current of the central processing unit 225. The power supply voltage is managed by the power management circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like. The central processing unit 225 accesses the read-only memory 227, the random-access memory 226, and the control register 222 via the CPU interface 224. The CPU interface 224 has a function of generating an access signal for any of the read-only memory 227, the random-access memory 226, and the control register 222 based on an address requested by the central processing unit 225.

As an arithmetic method of the central processing unit 225, a method may be employed in which the read-only memory 227 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of processing is conducted by a dedicated arithmetic circuit and the other part of the arithmetic processing is conducted by the central processing unit 225 using a program.

Such an RFCPU 211 has the same function with that of the semiconductor device shown in Embodiment Mode 3 and can achieve not only an increase in processing speed but also reduction in power consumption. This makes it possible to ensure the operation for a long period of time even when the capacitor portion 229 which supplies power is downsized.

Since halogen is contained in the single crystal semiconductor layer, the junction leakage current can be reduced even when the gate length is shorthand. FIG. 17 illustrates the mode of the RFCPU, but for example, a substrate having an SOI structure may be used for a semiconductor device having a communication function, an arithmetic function and a memory function, such as an IC tag.

Embodiment Mode 5

Figure 18:
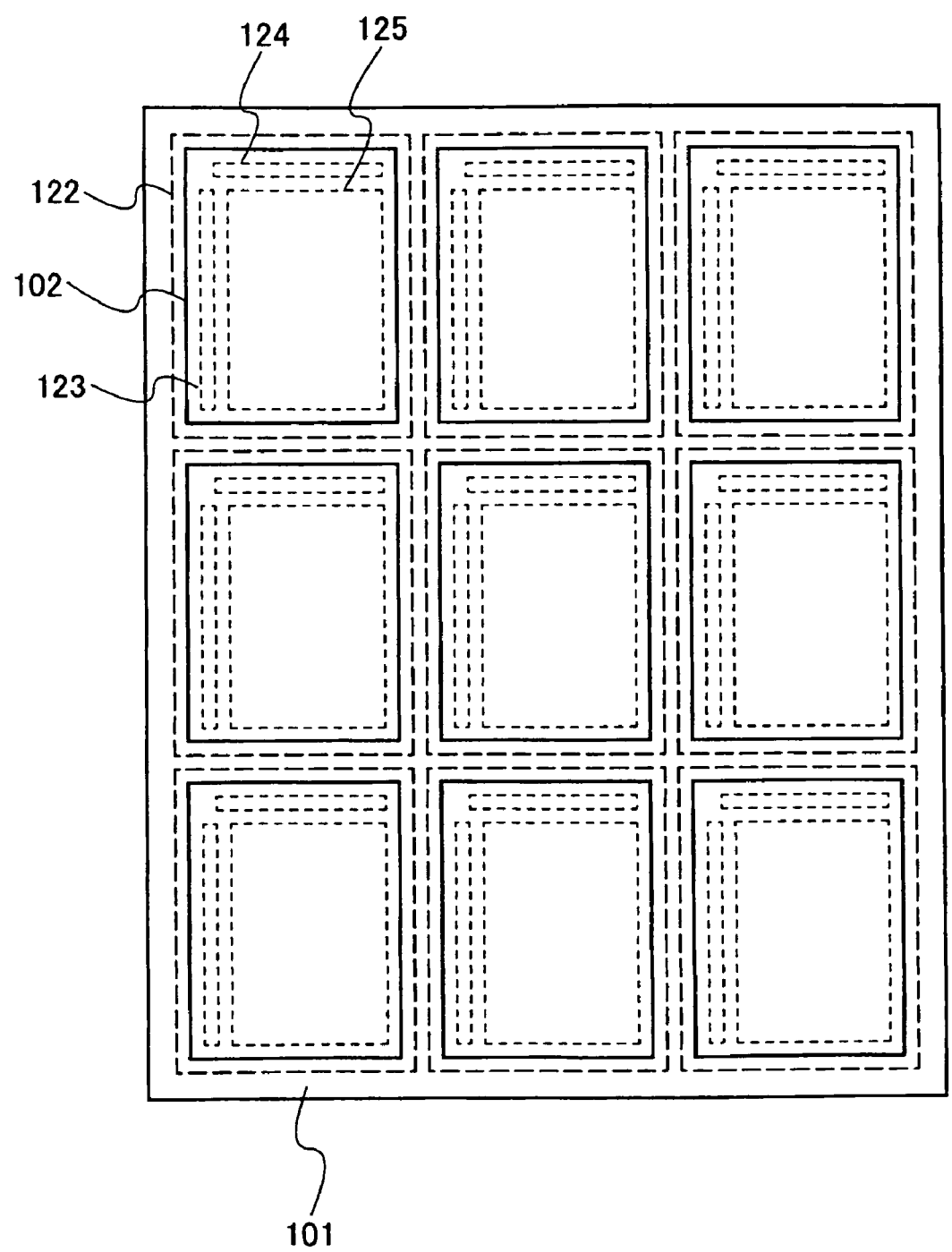
FIG. 18 is a plane view illustrating a case in which a single crystal semiconductor layer is bonded to a mother glass for manufacture of a display panel.

This embodiment mode shows one example of a display device manufactured using the substrate having an SOI structure that is described by Embodiment Mode 1 or 2. FIG. 18 illustrates the case where the single crystal semiconductor layers 102 is bonded to a mother glass used as a support substrate 101 to the single crystal semiconductor layer for manufacturing a display panel. A plurality of display panels is taken out from the mother glass, and the single crystal semiconductor layers 102 are preferably bonded to match formation regions of display panels 122. Since a mother glass substrate has a larger area than a semiconductor substrate, it is preferable that a plurality of single crystal semiconductor layers 102 be each arranged within the formation regions of the display panels 122. Accordingly, even if the plurality of single crystal semiconductor layers 102 are arranged over the support substrate 101, a sufficient space can be provided between adjacent single crystal semiconductor layers 102. Each of the display panels 122 includes a scan line driver circuit region 123, a signal line driver circuit region 124, and a pixel formation region 125. The single crystal semiconductor layer 102 is bonded to the support substrate 101 so as to include these regions.

Figure 19A:
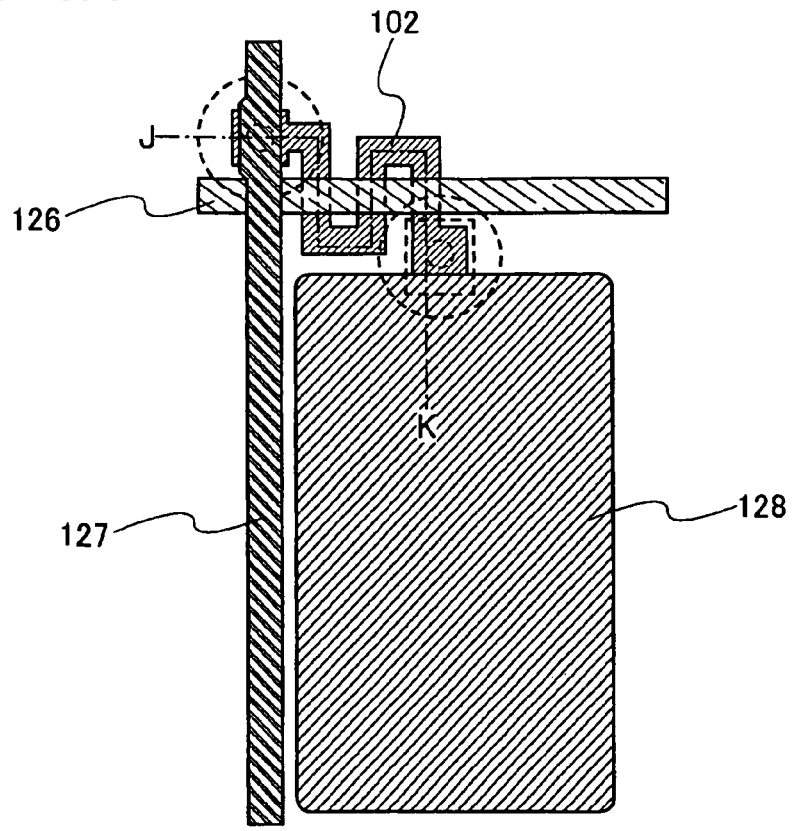
FIG. 19A is a top view showing an example of a liquid crystal display device that includes a pixel transistor using a single crystal semiconductor layer.
Figure 19B:
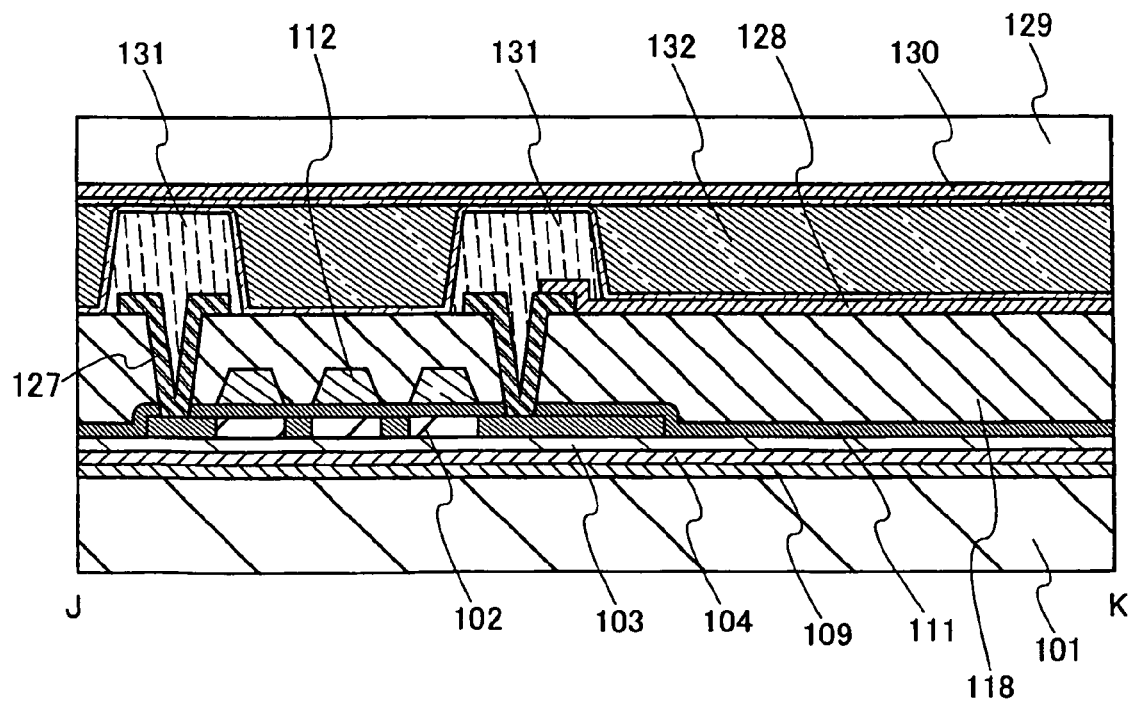
FIG. 19B is a cross-sectional view thereof.

FIGS. 19A and 19B illustrate an example of a pixel of a liquid crystal display device in which a pixel transistor is formed using a single crystal semiconductor layer. FIG. 19A is a plan view of a pixel, in which a scan line 126 intersects the single crystal semiconductor layer 102 and a signal line 127 and a pixel electrode 128 are connected to the single crystal semiconductor layer 102. FIG. 19B is a cross-sectional view taken along the line J-K of FIG. 19A.

In FIG. 19B, a pixel transistor has a stacked structure in which the blocking layer 109, the bonding layer 104, the oxide film 103, and the single crystal semiconductor layer 102 are stacked over the support substrate 101. The pixel electrode 128 is provided over an interlayer insulating film 118. In a contact hole provided in the interlayer insulating film 118, the single crystal semiconductor layer 102 and the signal line 127 are connected to each other, and thus, a columnar spacer 131 is provided in the contact hole so as to fill the depression generated in etching the interlayer insulating film 118. A counter substrate 129 is provided with a counter electrode 130. A liquid crystal layer 132 is formed by filling a space formed by the columnar spacer 131 with liquid crystal.

Figure 20A:
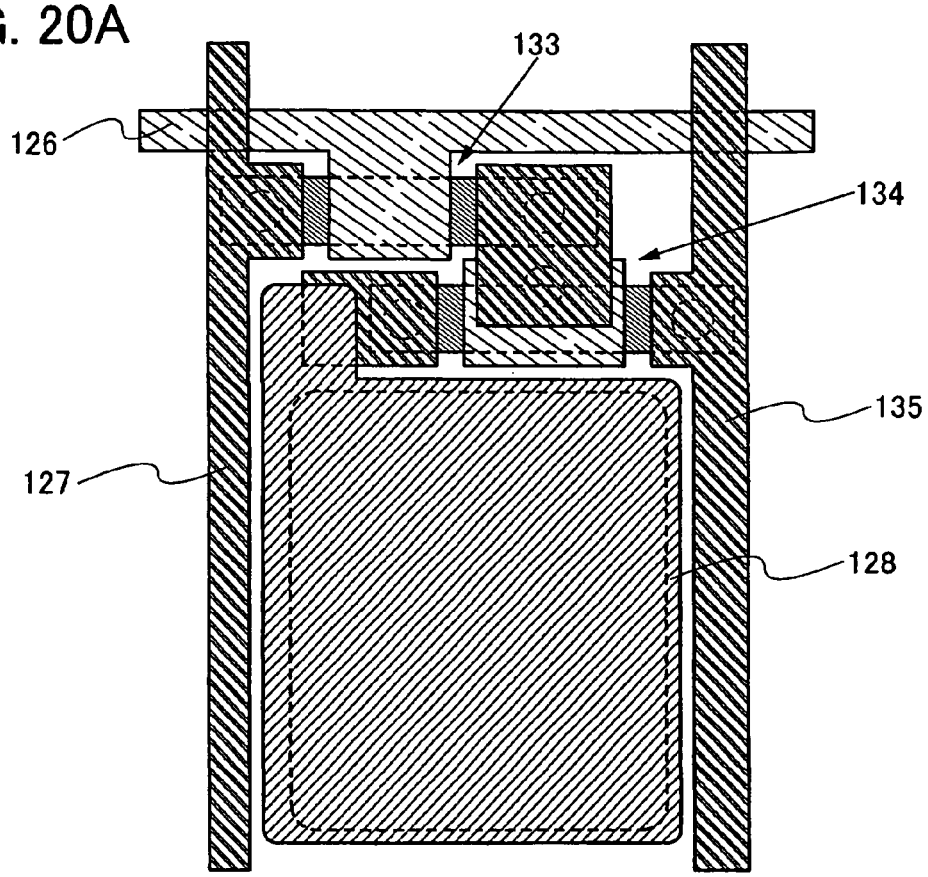
FIG. 20A is a top view showing an example of an electroluminescence display device that includes a pixel transistor using a single crystal semiconductor layer.
Figure 20B:
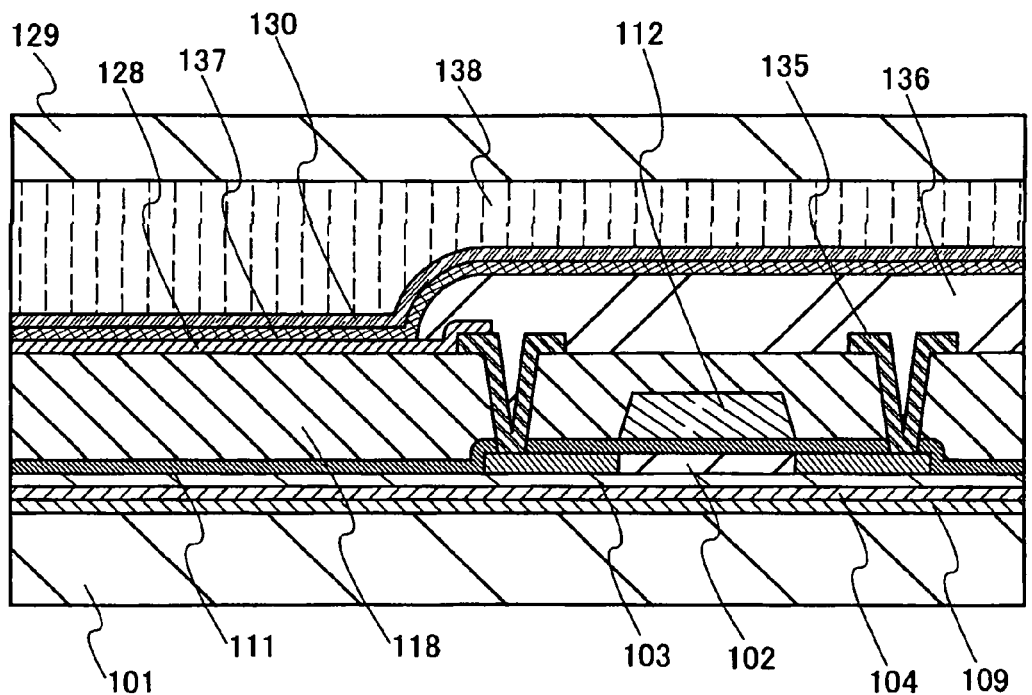
FIG. 20B is a cross-sectional view thereof.

FIGS. 20A and 20B illustrate an example of an electroluminescent display device including pixel transistors formed using a single crystal semiconductor layer. FIG. 20A shows a plan view of a pixel, which has a selection transistor 133 connected to a signal line 127 and a display control transistor 134 connected to a power supply line 135 as the pixel transistors. This display device has a structure in which each pixel is provided with a light emitting element that has a layer (EL layer) formed to contain an electroluminescent material between electrodes. A pixel electrode 128 is connected to the display control transistor 134. FIG. 20B is a cross-sectional view showing a structure of the display control transistor as a main portion of such a pixel.

In FIG. 20B, the display control transistor has a stacked structure in which the blocking layer 109, the bonding layer 104, and the oxide film 103, and the single crystal semiconductor layer 102 are stacked over the support substrate 101. The structures of the blocking layer 109, the bonding layer 104, the oxide film 103, the single crystal semiconductor layer 102, the interlays insulating film 118 and the like are similar to those in FIG. 19B. A peripheral portion of the pixel electrode 128 is surrounded by an insulating partition layer 136. Over the pixel electrode 128, an EL layer 137 is formed. Over the EL layer 137, a counter electrode 130 is formed. The pixel portion is filled with a sealing resin 138 and is provided with a counter substrate 129 as a reinforcing plate.

In the electroluminescent display device of this embodiment mode, such pixels are arranged in matrix to form a display screen. In this case, a channel portion of each pixel transistor is formed using the single crystal semiconductor layer 102. Therefore, there are advantages in that characteristics do not vary from transistor to transistor and emission luminescence does not vary from pixel to pixel. Therefore, drive with the brightness of a light emitting element being controlled by a current becomes easy, and a correction circuit that corrects variation of transistor characteristics becomes unnecessary. Thus, a load on a driver circuit can be reduced. Furthermore, because a light-transmitting substrate such as glass can be selected as the support substrate 101, a bottom-emission electroluminescent display device which emits light from the support substrate 101 side can be formed.

As described above, a transistor can be formed also over mother glass which is used for manufacturing display panels, by using a single crystal semiconductor layer. The transistor formed using the single crystal semiconductor layer is superior to a transistor formed using amorphous silicon in all operating characteristics such as current drive capability; therefore, the transistor can be downsized. Accordingly, an aperture ratio of a pixel portion in a display panel can be increased. Furthermore, since a microprocessor like the one illustrated in FIG. 16 or an RFCPU like the one illustrated in FIG. 17 can be formed in a display device having such a display panel, the display device can be provided with a function as a computer. Moreover, a display which is capable of data input and output without contact can be manufactured.

Embodiment Mode 6

Figure 21A:
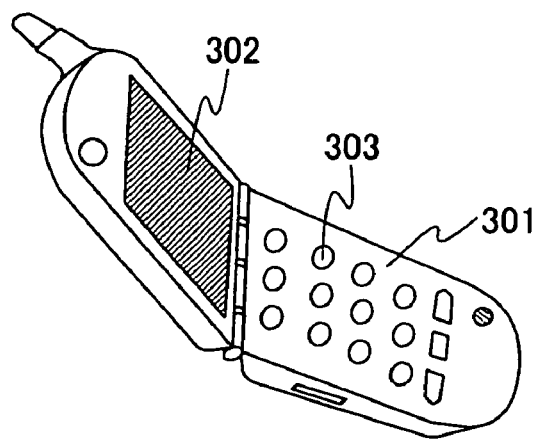
FIGS. 21A to 21C are diagrams each describing an example of an electronic apparatus according to the present invention.
Figure 21B:
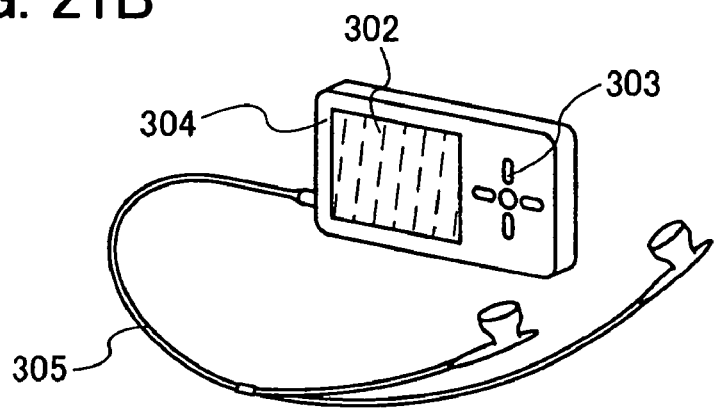
Figure 21C:
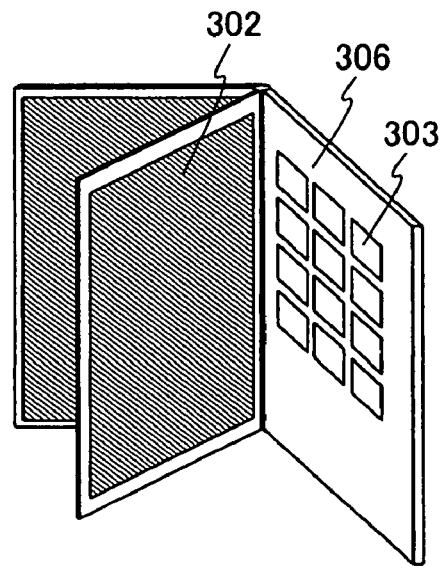

This embodiment mode illustrated electronic devices completed by using the substrate having an SOI structure that is described by Embodiment Mode 1 or 2. Examples of electronic devices include a camera such as a video camera or a digital camera, a navigation system, a sound reproducing device (a car audio, an audio component, or the like), a computer, a game machine, a portable information terminal (a mobile computer, a cellular phone, a mobile game machine, an electronic book, or the like), an image reproducing device having a recording medium (specifically, a device for reproducing content of a recording medium such as a digital versatile disc (DVD) and having a display for displaying the reproduced image), and the like. FIGS. 21A to 21C illustrates examples of electronic devices according to the present invention.

FIG. 21A shows an example of a cellular phone 301. This cellular phone 301 has a display portion 302, operation switches 303, and the like. In the display portion 302, the liquid crystal display device described with reference to FIGS. 19A and 19B or the electroluminescent display device described with reference to FIGS. 20A and 20B can be used. With the use of the display device of this embodiment mode, a display portion with little display unevenness and high image quality can be formed. In addition, of the semiconductor device of this embodiment mode can be used for a microprocessor or a memory which is included in the cellular phone 301.

FIG. 21B shows a digital player 304, which is a typical example of an audio device. The digital player 304 shown in FIG. 21B has a display portion 302, operation switches 303, earphones 305, and the like. Instead of the earphones 305, headphones or wireless earphones can be used. In the digital player 304, the semiconductor device of this embodiment mode can be used for a memory portion which stores music information or a microprocessor which operates the digital player 304. The digital player 304 having this structure can achieve reductions in size and weight. By application of the liquid crystal display device described with reference to FIGS. 19A and 19B or the electroluminescent display device described with reference to FIGS. 20A and 20B to the display portion 302, the display portion 302 can display an image or textual information with high definition even if it has a screen size of about 0.3 inches to 2 inches.

FIG. 21C illustrates an electronic book 306. This electronic book 306 has a display portion 302, operation switches 303 and the like. A modem may be built in, or a structure in which information can be transmitted and received wirelessly may be employed. In the electronic book 306, the semiconductor device of this embodiment mode can be used for a memory portion which stores information or a microprocessor which operates the electronic book 306. In the memory portion, a NOR-type nonvolatile memory with a memory capacity of 20 gigabytes (GB) to 200 gigabytes (GB) can be used, with which images or sounds (music) can be stored and reproduced. By application of the liquid crystal display device described with reference to FIGS. 19A and 19B or the electroluminescent display device described with reference to FIGS. 20A and 20B to the display portion 302, the display portion 302 can perform display with high image quality.

This application is based on Japanese Patent Application serial no. 2007-133065 filed with Japan Patent Office on May 18, 2007, the entire contents of which are hereby incorporated by reference.

What is claimed is:

1. A method for manufacturing a semiconductor substrate comprising the steps of:
    performing first heat treatment in an oxidizing atmosphere containing first halogen to form an oxide film containing the first halogen on a surface of a single crystal semiconductor substrate;
    irradiating the oxide film containing the first halogen with an ion of second halogen accelerated in an electric field, whereby a separation layer is formed in the single crystal semiconductor substrate and the second halogen is contained in the single crystal semiconductor substrate;
    forming a bonding layer on the oxide film containing the first halogen;
    bonding the single crystal semiconductor substrate to a support substrate with the bonding layer interposed therebetween; and
    performing second heat treatment to separate a part of the single crystal semiconductor substrate along the separation layer, thereby, forming a crystalline semiconductor layer containing the second halogen on the support substrate.

2. A method for manufacturing a semiconductor substrate according to claim 1, further comprising a step of forming an insulating film containing nitrogen on the oxide film containing the first halogen before forming the bonding layer.

3. A method for manufacturing a semiconductor substrate according to claim 1, wherein the bonding layer contains hydrogen of greater than or equal to $5 \times 10^{19}$ atoms/cm$^3$ and equal to or less than $5 \times 10^{21}$ atoms/cm$^3$.

4. A method for manufacturing a semiconductor substrate according to claim 1, wherein the oxidizing atmosphere containing the first halogen is an atmosphere in which one or more kinds of gases selected from HCl, HF, NF$_3$, HBr, Cl$_2$, ClF$_3$, BCl$_3$, F$_2$, and Br$_2$ are added to oxygen.

5. A method for manufacturing a semiconductor substrate according to claim 1, wherein the ion of the second halogen is an ion of fluorine, an ion of chlorine, or an ion of bromine.

6. A method for manufacturing a semiconductor substrate according to claim 1, further comprising a step of performing third heat treatment to desorb the second halogen contained in the formation of the separation layer.

7. A method for manufacturing a semiconductor substrate according to claim 2, wherein as the insulating film containing nitrogen, a single-layer of a single-layer structure or a plurality of films of a stacked structure selected from a silicon nitride film, a silicon nitride oxide film, a silicon oxynitride film, an aluminum nitride film, and/or an aluminum nitride oxide film is formed.

8. A method for manufacturing a semiconductor substrate according to claim 6, wherein the third heat treatment is performed at a temperature of higher than or equal to 400° C. and equal to or lower than 730° C.

9. A method for manufacturing a semiconductor device comprising the steps of:
    performing first heat treatment in an oxidizing atmosphere containing first halogen to form an oxide film containing the first halogen on a surface of a single crystal semiconductor substrate;
    irradiating the oxide film containing the first halogen with an ion of second halogen accelerated in an electric field, whereby a separation layer is formed in the single crystal semiconductor substrate and the second halogen is contained in the single crystal semiconductor substrate;
    forming a bonding layer on the oxide film containing the first halogen;
    bonding the single crystal semiconductor substrate to a support substrate with the bonding layer interposed therebetween;
    performing second heat treatment to separate a part of the single crystal semiconductor substrate along the separation layer, thereby, forming a crystalline semiconductor layer containing the second halogen on the support substrate; and
    forming a field effect transistor in which at least a source region, a drain region, and a channel formation region are provided in the crystalline semiconductor layer.

10. A method for manufacturing a semiconductor substrate comprising the steps of:
    performing first heat treatment in an oxidizing atmosphere containing first halogen to form an oxide film containing the first halogen on a surface of a single crystal semiconductor substrate;

irradiating the oxide film containing the first halogen with an ion of second halogen accelerated in an electric field, whereby a separation layer is formed in the single crystal semiconductor substrate and the second halogen is contained in the single crystal semiconductor substrate;

forming a bonding layer on a support substrate;

bonding the single crystal semiconductor substrate to the support substrate with the bonding layer interposed therebetween; and performing second heat treatment to separate a part of the single crystal semiconductor substrate along the separation layer, thereby, forming a crystalline semiconductor layer containing the second halogen on the support substrate.

11. A method for manufacturing a semiconductor substrate according to claim 10,
further comprising a step of forming an insulating film containing nitrogen on the support substrate before forming the bonding layer.

12. A method for manufacturing a semiconductor substrate according to claim 10,
wherein the bonding layer contains hydrogen of greater than or equal to $5\times10^{19}$ atoms/cm$^3$ and equal to or less than $5\times10^{21}$ atoms/cm$^3$.

13. A method for manufacturing a semiconductor substrate according to claim 10,
wherein the oxidizing atmosphere containing the first halogen is an atmosphere in which one or more kinds of gases selected from HCl, HF, NF$_3$, HBr, Cl$_2$, ClF$_3$, BCl$_3$, F$_2$, and Br$_2$ are added to oxygen.

14. A method for manufacturing a semiconductor substrate according to claim 10,
wherein the ion of the second halogen is an ion of fluorine, an ion of chlorine, or an ion of bromine.

15. A method for manufacturing a semiconductor substrate according to claim 10,
further comprising a step of performing third heat treatment to desorb the second halogen contained in the formation of the separation layer.

16. A method for manufacturing a semiconductor substrate according to claim 11,
wherein as the insulating film containing nitrogen, a single-layer of a single-layer structure or a plurality of films of a stacked structure selected from a silicon nitride film, a silicon nitride oxide film, a silicon oxynitride film, an aluminum nitride film, and/or an aluminum nitride oxide film is formed.

17. A method for manufacturing a semiconductor substrate according to claim 15,
wherein the third heat treatment is performed at a temperature of higher than or equal to 400° C. and equal to or lower than 730° C.

18. A method for manufacturing a semiconductor device comprising the steps of:
performing first heat treatment in an oxidizing atmosphere containing first halogen to form an oxide film containing the first halogen on a surface of a single crystal semiconductor substrate;

irradiating the oxide film containing the first halogen with an ion of second halogen accelerated in an electric field, whereby a separation layer is formed in the single crystal semiconductor substrate and the second halogen is contained in the single crystal semiconductor substrate;

forming a bonding layer on a support substrate;

bonding the single crystal semiconductor substrate to the support substrate with the bonding layer interposed therebetween;

performing second heat treatment to separate a part of the single crystal semiconductor substrate along the separation layer, thereby, forming a crystalline semiconductor layer containing the second halogen on the support substrate; and forming a field effect transistor in which at least a source region, a drain region, and a channel formation region are provided in the crystalline semiconductor layer.

19. A method for manufacturing a semiconductor substrate comprising the steps of:
performing first heat treatment in an oxidizing atmosphere containing first halogen to form an oxide film containing the first halogen on a surface of a single crystal semiconductor substrate;

irradiating the oxide film containing the first halogen with an ion of second halogen accelerated in an electric field, whereby a separation layer is formed in the single crystal semiconductor substrate and the second halogen is contained in the single crystal semiconductor substrate;

bonding the single crystal semiconductor substrate to a support substrate; and performing second heat treatment to separate a part of the single crystal semiconductor substrate along the separation layer, thereby, forming a crystalline semiconductor layer containing the second halogen on the support substrate.

* * * * *

UNITED STATES PATENT AND TRADEMARK OFFICE
CERTIFICATE OF CORRECTION

| | | |
|---|---|---|
| PATENT NO. | : 7,910,457 B2 | Page 1 of 1 |
| APPLICATION NO. | : 12/078084 | |
| DATED | : March 22, 2011 | |
| INVENTOR(S) | : Shunpei Yamazaki | |

It is certified that error appears in the above-identified patent and that said Letters Patent is hereby corrected as shown below:

At column 6, line 40, "$Si(OH_2H_5)_4$" should be --$Si(OC_2H_5)_4$--;

At column 12, line 8, "$Si(OH_2H_5)_4$" should be --$Si(OC_2H_5)_4$--.

Signed and Sealed this
Sixteenth Day of August, 2011

David J. Kappos
*Director of the United States Patent and Trademark Office*